(12) United States Patent
Asakura

(10) Patent No.: US 12,088,942 B2
(45) Date of Patent: Sep. 10, 2024

(54) IMAGING DEVICE AND ELECTRONIC DEVICE

(71) Applicant: SONY SEMICONDUCTOR SOLUTIONS CORPORATION, Kanagawa (JP)

(72) Inventor: Luonghung Asakura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/999,414

(22) PCT Filed: May 28, 2021

(86) PCT No.: PCT/JP2021/020398
§ 371 (c)(1),
(2) Date: Nov. 21, 2022

(87) PCT Pub. No.: WO2021/246311
PCT Pub. Date: Dec. 9, 2021

(65) Prior Publication Data
US 2023/0239593 A1     Jul. 27, 2023

(30) Foreign Application Priority Data

Jun. 5, 2020 (JP) ................................ 2020-098795

(51) Int. Cl.
*H04N 25/766*     (2023.01)
*H01L 27/146*     (2006.01)
(Continued)

(52) U.S. Cl.
CPC ..... *H04N 25/766* (2023.01); *H01L 27/14621* (2013.01); *H01L 27/14623* (2013.01);
(Continued)

(58) Field of Classification Search
CPC ......... H01L 27/14621; H01L 27/14623; H01L 27/14645; H04N 25/767; H04N 25/771;
(Continued)

(56) References Cited

U.S. PATENT DOCUMENTS 8,723,093 B2 *   5/2014   Krymski ........... H01L 27/14609
                                                                           257/E27.131
9,961,290 B2 *   5/2018   Kim ..................... H04N 25/40
(Continued)

FOREIGN PATENT DOCUMENTS

JP     2012-238951 A     12/2012
JP     2017-118191 A     6/2017
JP        6508530 B2     5/2019

OTHER PUBLICATIONS

International Search Report and Written Opinion of PCT Application No. PCT/JP2021/020398, issued on Aug. 10, 2021, 10 pages of ISRWO.

*Primary Examiner* — Pritham D Prabhakher
(74) *Attorney, Agent, or Firm* — CHIP LAW GROUP

(57) ABSTRACT

An imaging device that includes a plurality of pixels each including a photoelectric conversion element and arranged in an array of matrix, a control line group including a plurality of control lines for controlling each of pixels aligned in a row direction, each arranged in each of rows of the array, and a plurality of reading lines (VSL) arranged in each of columns for transferring a pixel signal read from each of pixels aligned in a column direction of the array, wherein the plurality of pixels includes a first pixel controlled by a control signal supplied from a first control line group including control lines in a first number among a plurality of control lines included in the control line group in each of pixels aligned in the row direction in at least one of rows of the array.

16 Claims, 27 Drawing Sheets

(51) Int. Cl.
*H04N 25/11* (2023.01)
*H04N 25/53* (2023.01)
*H04N 25/703* (2023.01)
*H04N 25/771* (2023.01)

(52) U.S. Cl.
CPC ....... *H01L 27/14645* (2013.01); *H04N 25/53* (2023.01); *H04N 25/771* (2023.01); *H04N 25/11* (2023.01); *H04N 25/703* (2023.01)

(58) Field of Classification Search
CPC .... H04N 25/766; H04N 25/53; H04N 25/533; H04N 25/11; H04N 25/703; H04N 25/531; H04N 25/532
USPC .......................................................... 348/296
See application file for complete search history.

(56) References Cited

U.S. PATENT DOCUMENTS

| | | | |
|---|---|---|---|
| 10,419,695 B2 * | 9/2019 | Sasago | H01L 27/14609 |
| 2012/0175497 A1 * | 7/2012 | Hynecek | G01J 1/44 |
| | | | 250/214 P |
| 2012/0175498 A1 * | 7/2012 | Krymski | H01L 27/14609 |
| | | | 250/208.1 |
| 2012/0248471 A1 * | 10/2012 | Kishi | G09G 3/3233 |
| | | | 257/40 |
| 2015/0062391 A1 * | 3/2015 | Murata | H04N 23/843 |
| | | | 348/280 |
| 2018/0109768 A1 * | 4/2018 | Murata | H04N 23/672 |
| 2018/0249104 A1 * | 8/2018 | Sasago | H01L 27/14621 |
| 2019/0114967 A1 * | 4/2019 | Yin | H10K 59/1213 |

* cited by examiner

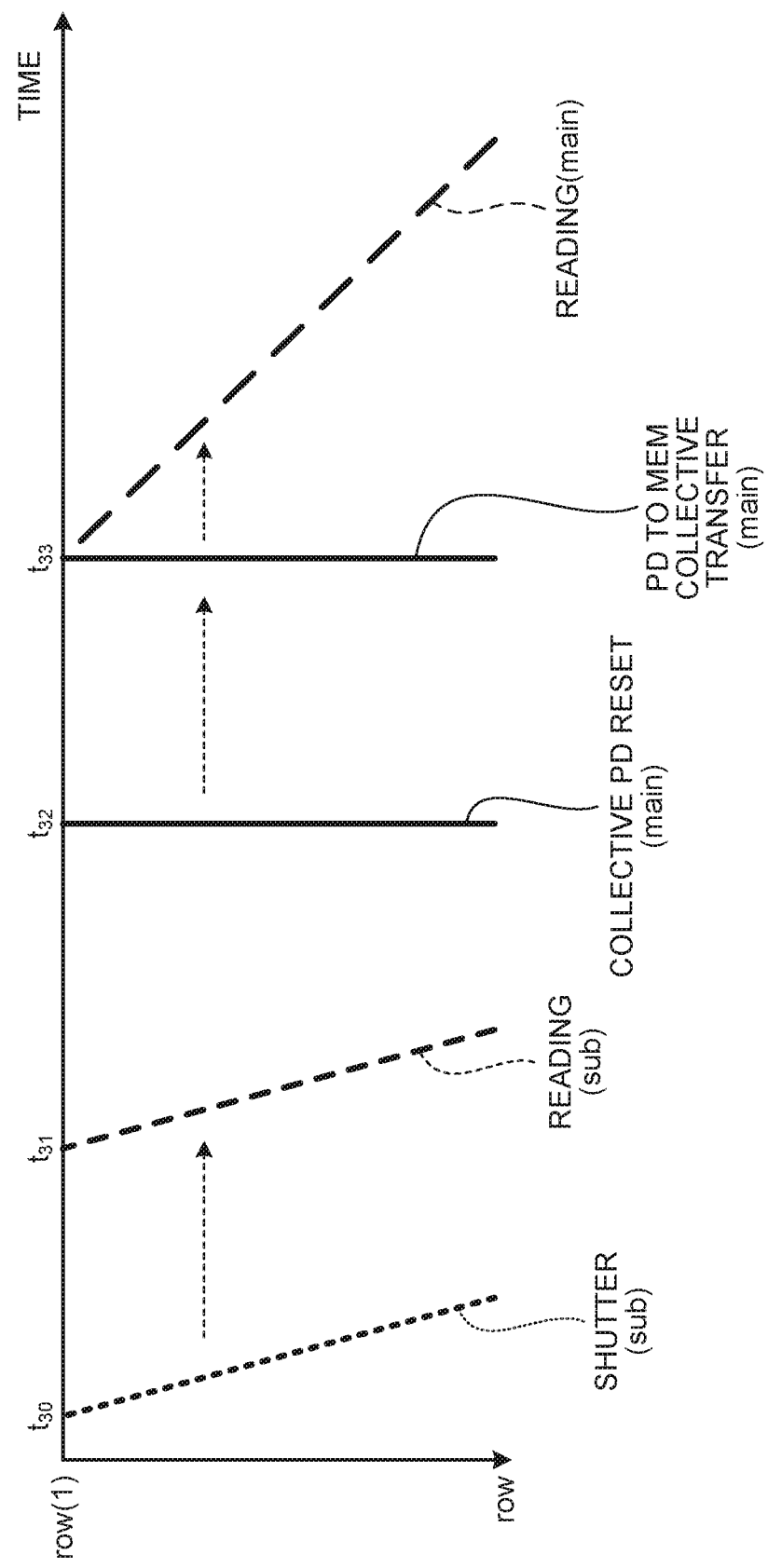

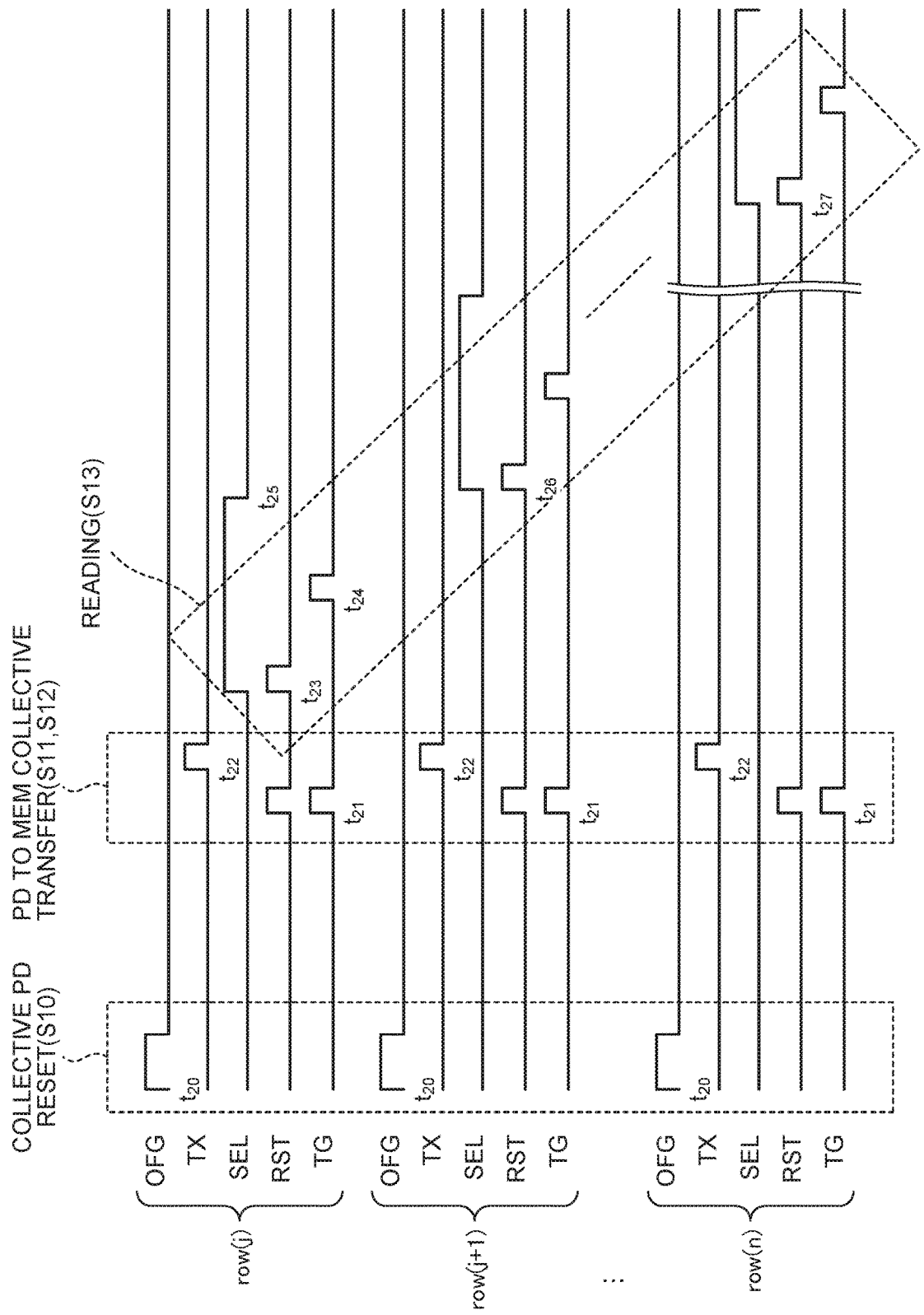

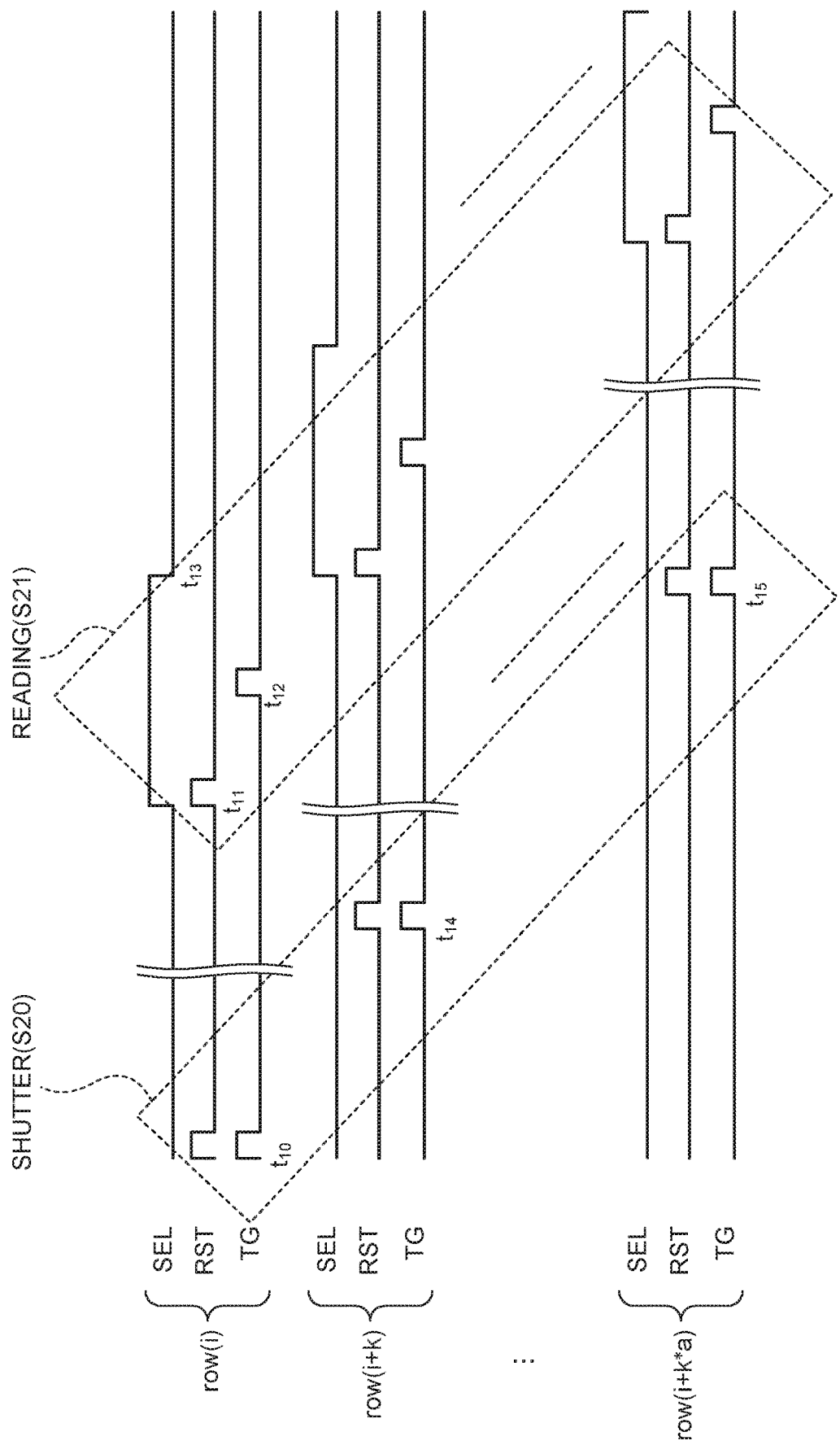

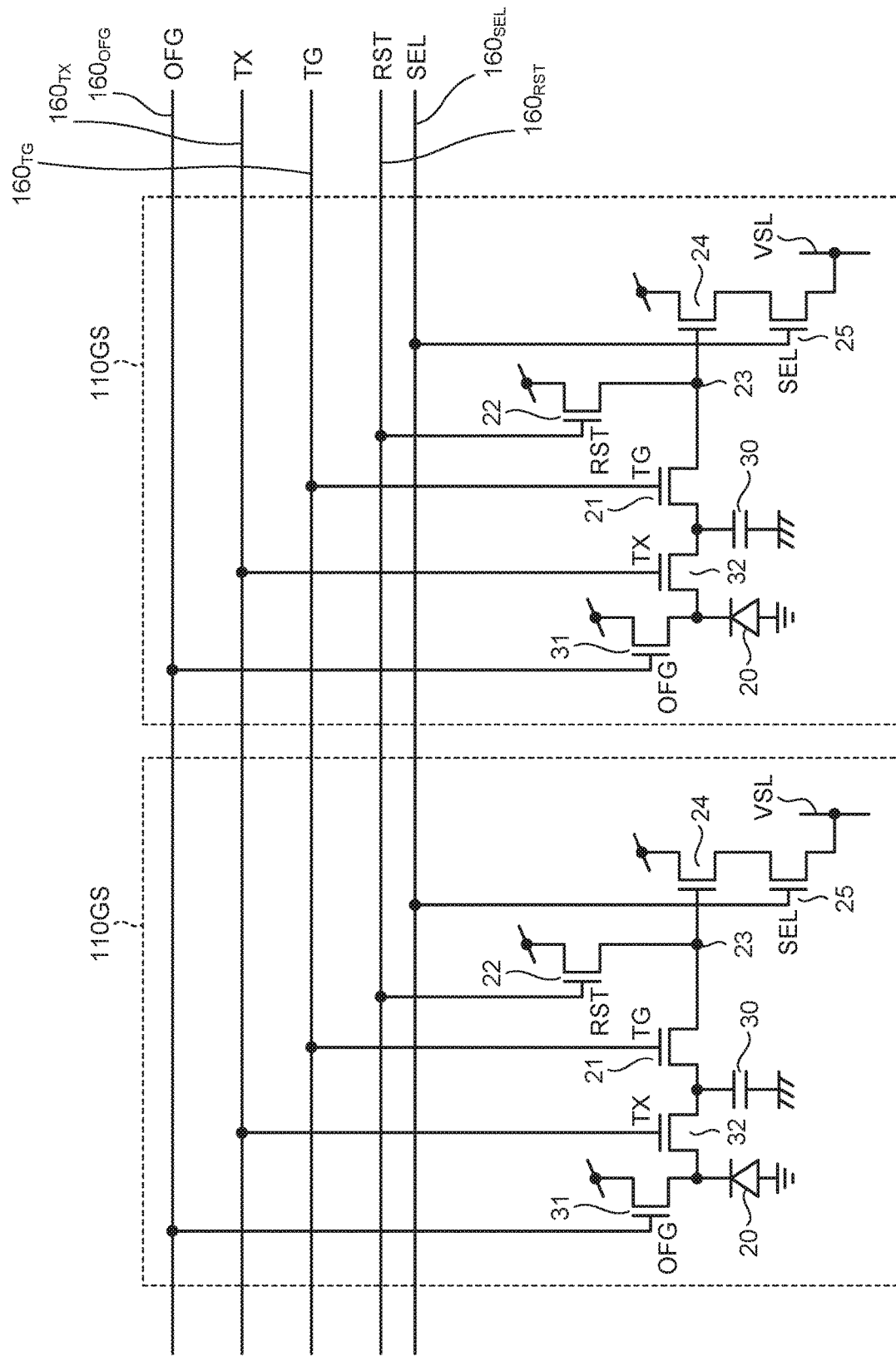

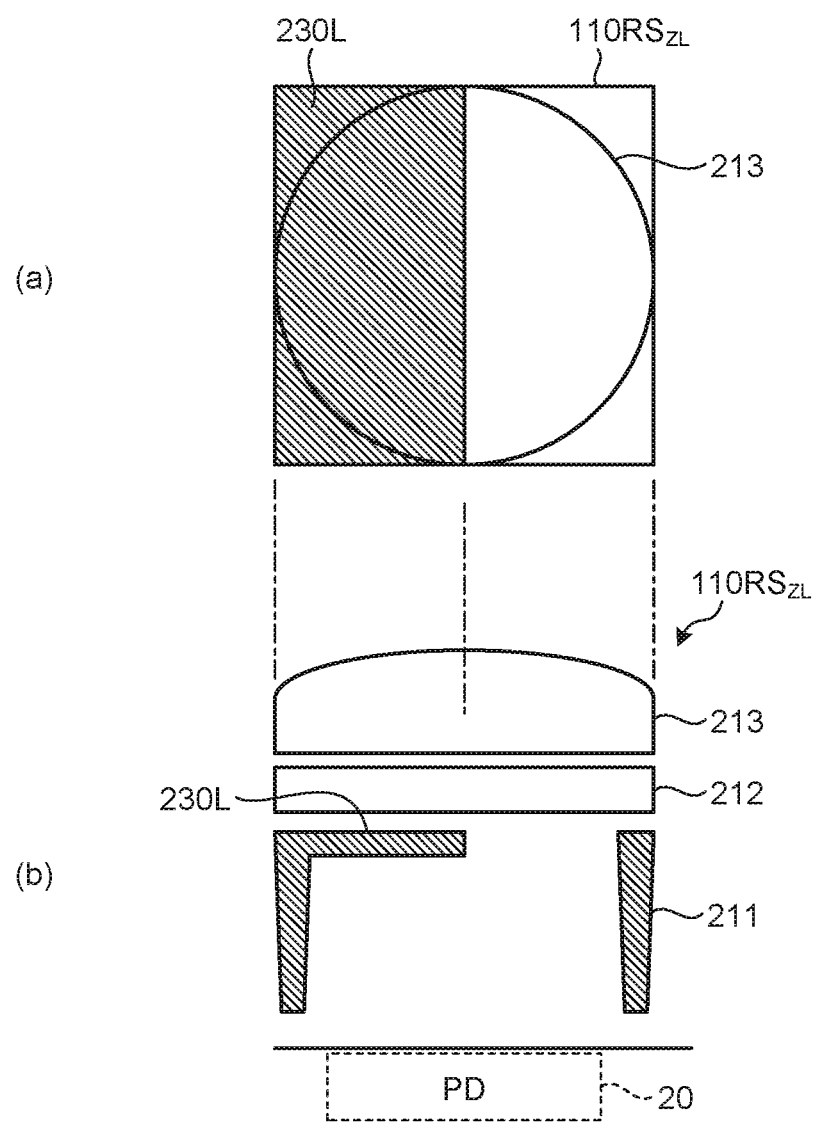

IMAGING DEVICE AND ELECTRONIC DEVICE

CROSS REFERENCE TO RELATED APPLICATIONS

This application is a U.S. National Phase of International Patent Application No. PCT/JP2021/020398 filed on May 28, 2021, which claims priority benefit of Japanese Patent Application No. JP 2020-098795 filed in the Japan Patent Office on Jun. 5, 2020. Each of the above-referenced applications is hereby incorporated herein by reference in its entirety.

FIELD

The present disclosure relates to an imaging device and an electronic device.

BACKGROUND

A global shutter method (hereinafter, GS method) is known as one of imaging methods in a pixel array in which pixels including a light receiving element are arranged in an array of matrix. The GS method guarantees exposure simultaneity in the pixel array, and several configurations have been proposed. As a representative example, for example, there is known a configuration that includes a memory region for temporarily accumulating charges generated by a light receiving element by exposure and enables synchronization of exposure start and end times throughout a pixel array by using the memory region.

Meanwhile, there is proposed a configuration in which a pixel for obtaining a main imaged image (referred to as main pixel) and a pixel for implementing a function different from that of the main pixel (referred to as sub-pixel) are mixed in a pixel arranged in a pixel array. Examples of the function implemented by the sub-pixel include an AF function and a live view function. In the AF function, an imaging result from the sub-pixel is used. In the live view function, an imaged image formed by the sub-pixel is output as a moving image to assist imaging performed by the main pixel.

CITATION LIST

Patent Literature

Patent Literature 1: Japanese Patent No. 6508530

SUMMARY

Technical Problem

In a pixel array, when a main pixel and a sub-pixel are mixed in a pixel row, the sub-pixel is required to be capable of being exposed and read at timing independent of that of the main pixel. When the main pixel and the sub-pixel can be controlled at independent timings, however, each pixel row includes more control lines, which may cause an increase in wiring defect and difficulty in miniaturization of a pixel.

An object of the present disclosure is to provide an imaging device and an electronic device capable of simplifying a configuration in a case where pixels that implement different functions are mixed in a pixel row.

Solution to Problem

For solving the problem described above, an imaging device according to one aspect of the present disclosure has a plurality of pixels each including a photoelectric conversion element and arranged in an array of matrix; a control line group including a plurality of control lines for controlling each of pixels aligned in a row direction, each arranged in each of rows of the array; and a plurality of reading lines arranged in each of columns for transferring a pixel signal read from each of pixels aligned in a column direction of the array, wherein the plurality of pixels includes: a first pixel controlled by a control signal supplied from a first control line group including control lines in a first number among a plurality of control lines included in the control line group in each of pixels aligned in the row direction in at least one of rows of the array; and a second pixel controlled by a control signal supplied from a second control line group including a control line in a second number smaller than the first number among a plurality of control lines included in the control line group.

BRIEF DESCRIPTION OF DRAWINGS

FIG. 11 is a schematic diagram depicting an example of operation in an imaging element according to the first embodiment.

FIG. 12A is a schematic diagram depicting the correspondence relation between an example of operation of the imaging element and a sequence chart of each pixel according to the first embodiment.

FIG. 12B is a schematic diagram depicting the correspondence relation between an example of operation of the imaging element and a sequence chart of each pixel according to the first embodiment.

FIG. 14 illustrates a configuration example in a case where the GS pixel and the RS pixel are not mixed in a pixel row.

FIG. 15A is a schematic diagram depicting an example of a pixel, in which a light shielding portion shields a ½ region of a light receiving surface from light, applicable to a first variation of the first embodiment.

DESCRIPTION OF EMBODIMENTS

Embodiments of the present disclosure will be described in detail below with reference to the drawings. Note that, in the following embodiments, the same signs are attached to the same parts, and thereby duplicate descriptions thereof are omitted.

Figure 1:
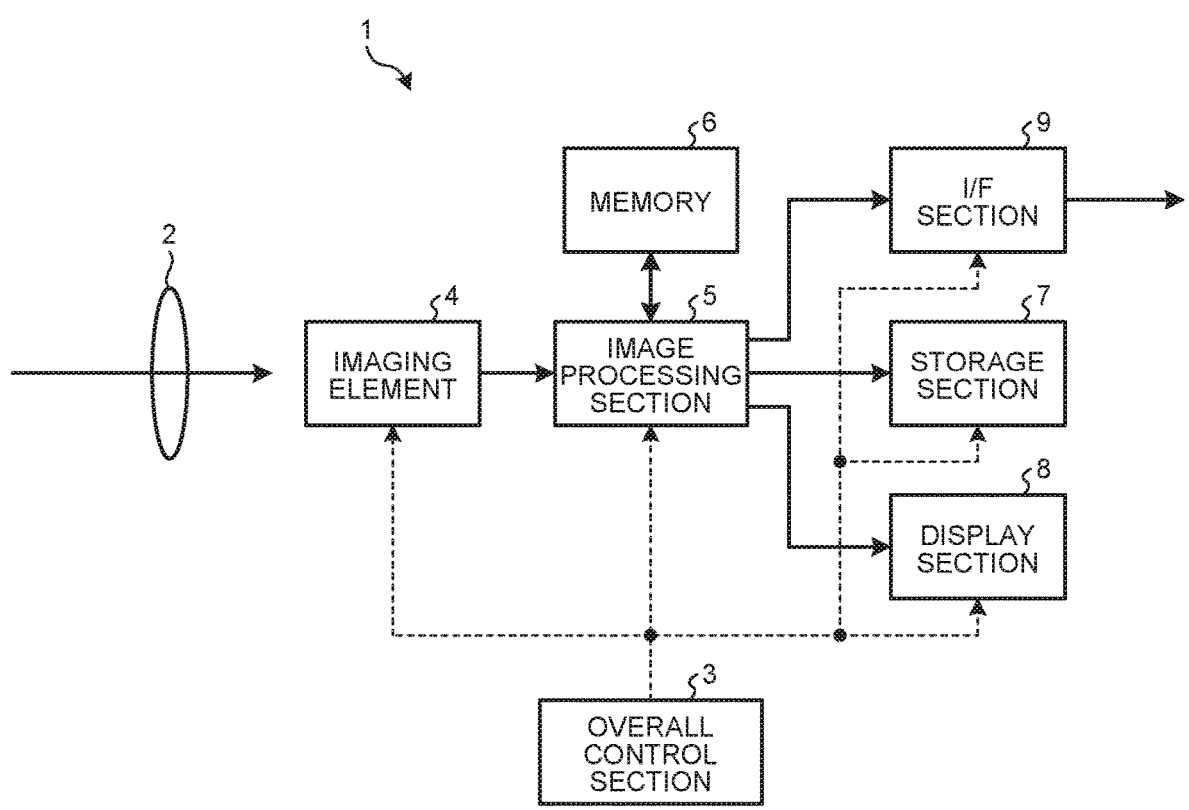
FIG. 1 is a block diagram depicting an exemplary configuration of an electronic device applicable to each embodiment in common.

The embodiments of the present disclosure will be described below in the following order.
1. Technology Applicable to Each Embodiment of Present Disclosure
2. Outline of Embodiments of Present Disclosure
3. First Embodiment
3-1. First Variation of First Embodiment
3-2. Second Variation of First Embodiment
3-3. Third Variation of First Embodiment
3-4. Fourth Variation of First Embodiment
4. Second Embodiment
5. Third Embodiment
6. Fourth Embodiment
6-1. Examples of Application of Technology of Present Disclosure 6-2. Example of Application to Mobile Body 1. Technology Applicable to Each Embodiment of Present Disclosure FIG. 1 is a block diagram depicting an exemplary configuration of an electronic device applicable to each embodiment in common. In FIG. 1, an electronic device 1 includes an optical system 2, an overall control section 3, an imaging element 4, an image processing section 5, a memory 6, a storage section 7, a display section 8, an interface (I/F) section 9, and an input device 10.

Here, for example, a digital still camera, a digital video camera, and a mobile phone and a smartphone with an imaging function can be applied as the electronic device 1. In addition, a monitoring camera, a vehicle-mounted camera, a medical camera, and any other camera can also be applied as the electronic device 1.

The imaging element 4 includes a pixel array. The pixel array includes a plurality of pixels. The plurality of pixels each includes a photoelectric conversion element, and is arranged in, for example, an array of matrix. The photoelectric conversion element photoelectrically converts received light into a charge. The imaging element 4 includes a drive circuit, a pixel circuit, and a signal processing circuit. The drive circuit drives the plurality of pixels. The pixel circuit reads a pixel signal based on the charge generated by the photoelectric conversion element from each of the plurality of pixels. The signal processing circuit generates image data on the basis of the read pixel signal.

The optical system 2 includes a main lens and a mechanism for driving the main lens. The main lens includes one or a combination of a plurality of lenses. The optical system 2 forms an image of image light (incident light) from a subject on a light receiving surface of the imaging element 4 via the main lens. In addition, the optical system 2 includes an autofocus (AF) mechanism and a zoom mechanism. The AF mechanism adjusts focus in accordance with a control signal. The zoom mechanism changes a zoom ratio in accordance with a control signal. In addition, the electronic device 1 may be configured such that the optical system 2 is detachable and can be replaced with another optical system 2.

The image processing section 5 executes predetermined image processing on the image data output from the imaging element 4. For example, the memory 6 including a frame memory is connected to the image processing section 5. The image processing section 5 writes the image data output from the imaging element 4 to the memory 6. The image processing section 5 executes predetermined image processing on the image data written in the memory 6, and writes the image data subjected to the image processing in the memory 6 again.

The storage section 7 is, for example, a non-volatile memory such as a flash memory and a hard disk drive, and stores the image data output from the image processing section 5 in a non-volatile manner. The display section 8 includes a display device and a drive circuit. The display device includes, for example, a liquid crystal display (LCD). The drive circuit drives the display device. The display section 8 can display an image based on the image data output by the image processing section 5. The I/F section 9 is an interface for transmitting the image data output from the image processing section 5 to the outside. For example, a universal serial bus (USB) can be applied as the I/F section 9. This is not a limitation, and the I/F section 9 may be an interface capable of being connected to a network by wired communication or wireless communication.

The input device 10 includes an operator for receiving user input. If the electronic device 1 is, for example, a digital still camera, a digital video camera, and a mobile phone or a smartphone with an imaging function, the input device 10 can include a shutter button or an operator. The shutter button is used to instruct the imaging element 4 to perform imaging. The operator implements the function of the shutter button.

The overall control section 3 includes, for example, a processor, such as a central processing unit (CPU), a read only memory (ROM), and a random access memory (RAM). The overall control section 3 controls the overall operation of the electronic device 1 by using the RAM as a work memory in accordance with a program preliminarily stored in the ROM. For example, the overall control section 3 can control the operation of the electronic device 1 in accordance with the user input received by the input device 10. In addition, the overall control section 3 can control the AF mechanism in the optical system 2 on the basis of an image processing result of the image processing section 5.

Figure 2:
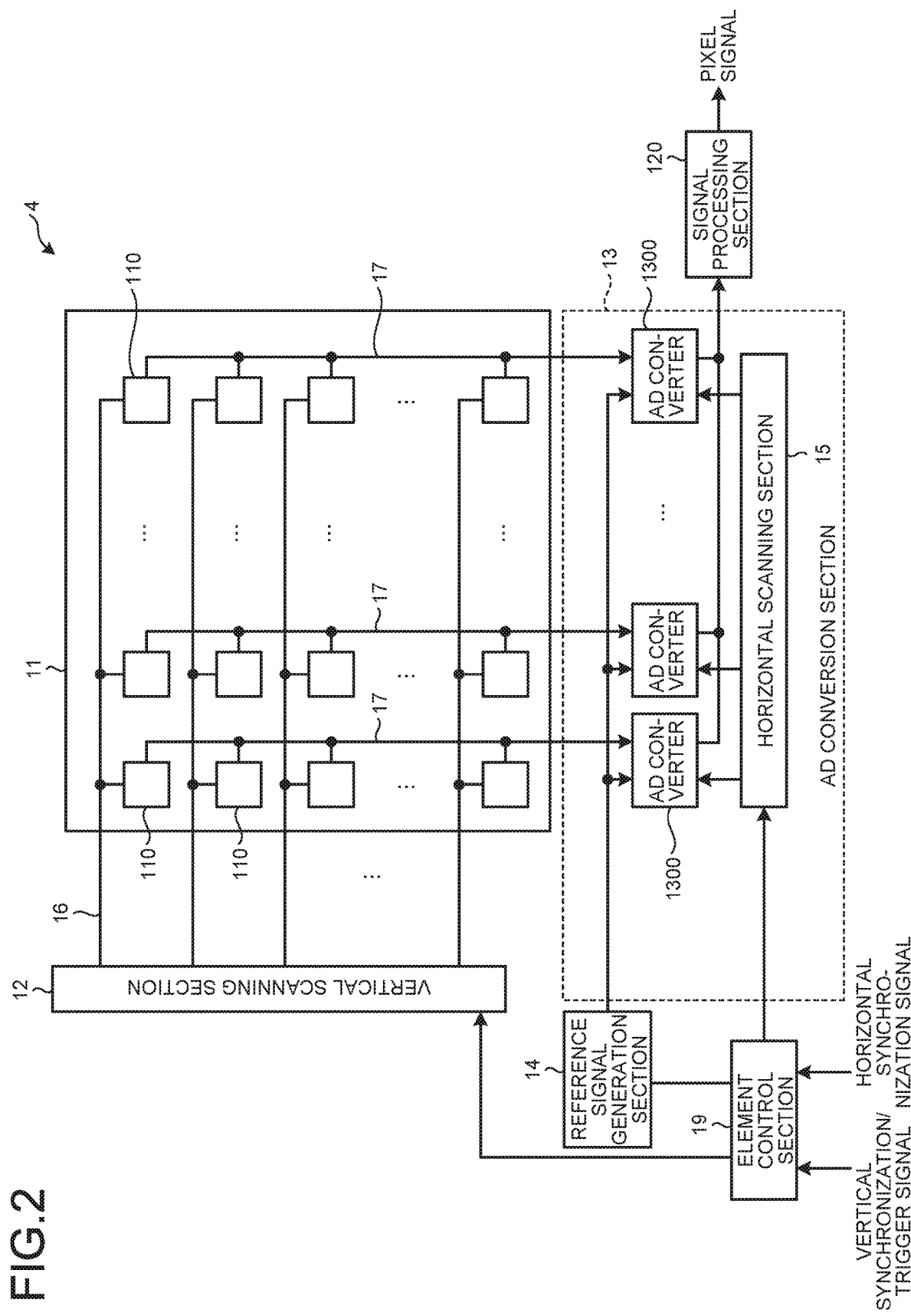
FIG. 2 is a block diagram depicting an example of a basic configuration of an imaging element 4 applicable to each embodiment in common.

FIG. 2 is a block diagram depicting an example of a basic configuration of the imaging element 4 applicable to each embodiment in common. In FIG. 2, the imaging element 4 includes a pixel array section 11, a vertical scanning section 12, an analog to digital (AD) conversion section 13, a pixel signal line 16, a vertical signal line 17, an output section 18, an element control section 19, and a signal processing section 120.

The pixel array section 11 includes a plurality of pixels 110 each including a photoelectric conversion element that photoelectrically converts received light. A photodiode can be used as the photoelectric conversion element. In the pixel array section 11, the plurality of pixels 110 is arranged in a matrix (two-dimensional lattice) in a horizontal direction (row direction) and a vertical direction (column direction). In the pixel array section 11, the arrangement of the pixels 110 in the row direction is referred to as a line. An image (image data) of one frame is formed by a pixel signal read from a predetermined number of lines in the pixel array section 11. For example, when 3000 pixels×2000 lines forms the image of one frame, the pixel array section 11 includes at least 2000 lines including at least 3000 pixels 110.

In addition, in the pixel array section 11, the pixel signal line 16 is connected to each row of pixels 110, and the vertical signal line 17 is connected to each column of pixels 110. The pixel signal line 16 is configured as a control line group including a plurality of control lines for supplying a control signal for driving each of the pixels 110 aligned in the row direction.

An end of the pixel signal line 16 which is not connected to the pixel array section 11 is connected to the vertical scanning section 12. The vertical scanning section 12 transmits a control signal, such as a drive pulse, used at the time when a pixel signal is read from the pixel 110 to the pixel array section 11 via the pixel signal line 16 under the control of the element control section 19 to be described later. An end of the vertical signal line 17 which is not connected to the pixel array section 11 is connected to the AD conversion section 13. The pixel signal read from the pixel is transmitted to the AD conversion section 13 via the vertical signal line 17.

Reading control of a pixel signal from a pixel will be schematically described. Reading of a pixel signal from a pixel is performed by transferring a charge accumulated in a photoelectric conversion element by exposure to a floating diffusion (FD) layer and converting the transferred charge into a voltage in the floating diffusion layer. The voltage obtained by converting the charge in the floating diffusion layer is output to the vertical signal line 17 via an amplifier.

More specifically, in the pixel 110, during exposure, an off-(open) state is established between the photoelectric conversion element and the floating diffusion layer, and a charge generated in accordance with light made incident by photoelectric conversion is accumulated in the photoelectric conversion element. After the exposure ends, the floating diffusion layer and the vertical signal line 17 are connected to each other in accordance with a selection signal supplied via the pixel signal line 16. Moreover, the floating diffusion layer is connected to a supply line of a power supply voltage VDD or a black level voltage in a short period of time in accordance with a reset pulse supplied via the pixel signal line 16, and the floating diffusion layer is reset. A voltage (defined as voltage P) of a reset level of the floating diffusion layer is output to the vertical signal line 17. Thereafter, an on-(closed) state is established between the photoelectric conversion element and the floating diffusion layer by a transfer pulse supplied via the pixel signal line 16. A charge accumulated in the photoelectric conversion element is transferred to the floating diffusion layer. A voltage (defined as voltage Q) in accordance with an amount of charges of the floating diffusion layer is output to the vertical signal line 17.

The AD conversion section 13 includes an AD converter 1300, a reference signal generation section 14, and a horizontal scanning section 15. The AD converter 1300 is provided for each vertical signal line 17. The AD converter 1300 is a column AD converter that performs AD conversion processing on each column of the pixel array section 11. The AD converter 1300 performs the AD conversion processing on a pixel signal supplied from the pixel 110 via the vertical signal line 17. The AD converter 1300 generates two digital values (values corresponding to voltage P and voltage Q) for correlated double sampling (CDS) processing for reducing noise. A specific example of the configuration and processing of the AD converter 1300 will be described later.

The AD converter 1300 supplies the generated two digital values to the signal processing section 120. The signal processing section 120 performs CDS processing on the basis of the two digital values supplied from the AD converter 1300, and generates a pixel signal (pixel data) from a digital signal. The pixel data generated by the signal processing section 120 is output to the outside of the imaging element 4.

The image data output from the signal processing section 120 is supplied to, for example, the image processing section 5, and sequentially stored in the memory 6, which is, for example, a frame buffer. When one frame of pixel data is stored in the frame buffer, the stored pixel data is read from the frame buffer as one frame of image data.

The reference signal generation section 14 generates a ramp signal RAMP used for each AD converter 1300 to convert a pixel signal into two digital values on the basis of an ADC control signal input from the element control section 19. A level (voltage value) of the ramp signal RAMP decreases at a fixed inclination with respect to time, or the level decreases stepwise. The reference signal generation section 14 supplies the generated ramp signal RAMP to each AD converter 1300. The reference signal generation section 14 includes, for example, a digital to analog (DA) conversion circuit.

The horizontal scanning section 15 sequentially outputs each digital value temporarily held in each AD converter 1300 to the signal processing section 120 by performing selective scanning, in which each AD converter 1300 is selected in a predetermined order, under the control of the element control section 19. The horizontal scanning section 15 includes, for example, a shift register and an address decoder.

The element control section 19 performs drive control on the vertical scanning section 12, the AD conversion section 13, the reference signal generation section 14, and the horizontal scanning section 15. The element control section 19 generates various drive signals serving as references for operations of the vertical scanning section 12, the AD conversion section 13, the reference signal generation section 14, and the horizontal scanning section 15. The element control section 19 generates a control signal to be supplied by the vertical scanning section 12 to each pixel 110 via the pixel signal line 16 on the basis of a vertical synchronization signal or an outside trigger signal supplied from the outside (for example, overall control section 3) and a horizontal synchronization signal. The element control section 19 supplies the generated control signal to the vertical scanning section 12.

The vertical scanning section 12 supplies various control signals including a drive pulse in the pixel signal line 16 of a selected pixel row of the pixel array section 11 to each pixel 110 for each line, and outputs a pixel signal from each pixel 110 to the vertical signal line 17 on the basis of the control signal supplied from the element control section 19. Note that the pixel signal line 16 includes a control line group including a plurality of control lines each of which supplies a control signal to each pixel 110. The vertical scanning section 12 includes, for example, a shift register and an address decoder.

The imaging element 4 configured as described above is a complementary metal oxide semiconductor (CMOS) image sensor of a column AD type in which the AD converters 1300 are arranged for each column.

(Pixel Compatible with Global Shutter Method)

Figure 3:
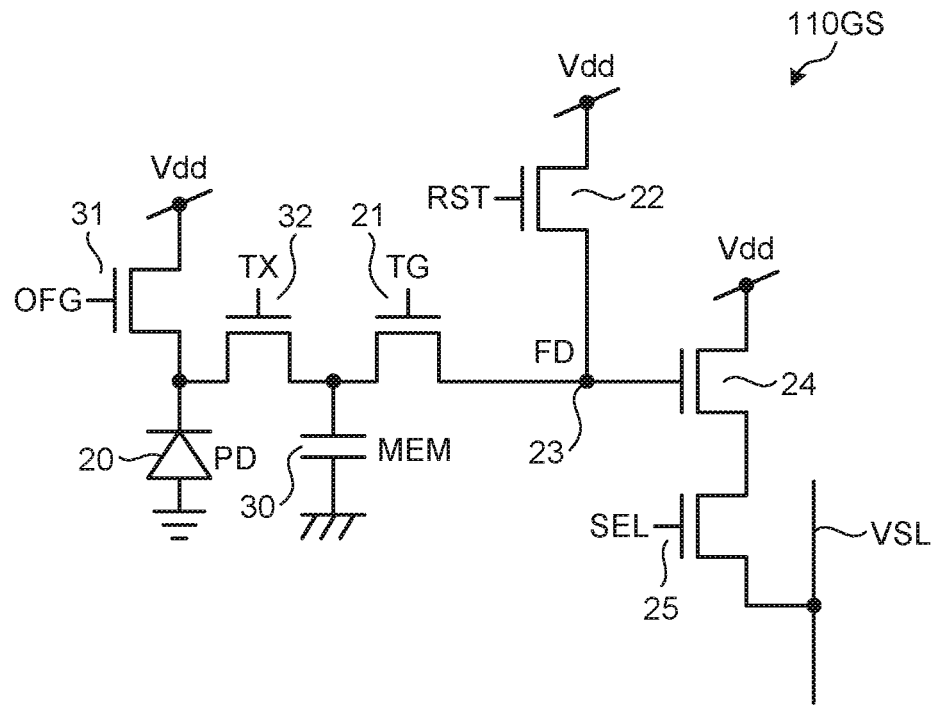
FIG. 3 is a circuit diagram depicting an exemplary configuration of a GS pixel applicable to each embodiment.

FIG. 3 is a circuit diagram depicting an exemplary configuration of a pixel 110GS applicable to each embodiment. The pixel 110GS corresponds to each of the above-described pixels 110, and serves as a first pixel. A pixel 110 in FIG. 3 has a configuration compatible with a global shutter method (GS method). Hereinafter, a pixel having a configuration compatible with the GS method is appropriately referred to as a GS pixel.

In FIG. 3, the pixel 110GS, which is a GS pixel, includes a photodiode 20 (hereinafter, PD 20) serving as a photoelectric conversion element, six transistors 21, 22, 24, 25, 31, and 32, and a storage 30 (hereinafter, MEM 30).

Note that, in this example, each of the transistors 21, 22, 24, 25, 31, and 32 uses an N-channel metal oxide semiconductor (MOS) field-effect transistor, for example. That is, each of the transistors 21, 22, 24, 25, 31, and 32 is turned on when a voltage applied to a gate is at a high level, and is turned off at a low level. Hereinafter, the N-channel MOS field effect transistor is referred to as an NMOS transistor.

The anode of the PD 20 is connected to, for example, ground potential, and the cathode thereof is connected to the source of the transistor 31 and the drain of the transistor 32. A power supply Vdd is connected to the drain of the transistor 31. The on/off state of transistor 31 is controlled by a control signal OFG supplied from the pixel signal line 16 (not depicted) to the gate. One end of the MEM 30 and the drain of the transistor 21 are connected to the source of the transistor 32. The on/off state of the transistor 32 is controlled by a control signal TX supplied from the pixel signal line 16 to the gate. The other end of the MEM 30 is connected to, for example, the ground potential.

The source of the transistor 21 is connected to the source of the transistor 22 and the gate of the transistor 24. A power supply Vdd is connected to the drain of the transistor 22. The on/off state of transistor 22 is controlled by a control signal RST supplied from the pixel signal line 16 to the gate. A floating diffusion layer 23 (hereinafter, FD 23) is formed at a connection point between the source of the transistor 21 and the source of the transistor 22.

A power supply Vdd is connected to the drain of the transistor 24, and the drain of the transistor 25 is connected to the source thereof. The transistor 24 functions as an amplifier that amplifies a signal input to the gate and outputs the amplified signal from the source. The source of the transistor 25 is connected to a vertical signal line VSL. The on/off state of transistor 25 is controlled by a control signal SEL supplied from the pixel signal line 16 to the gate.

Here, the pixel 110GS is driven by five control signals of the control signals OFG, TX, TG, RST, and SEL, and thus five control lines are necessary for driving the pixel 110GS.

Figure 4:
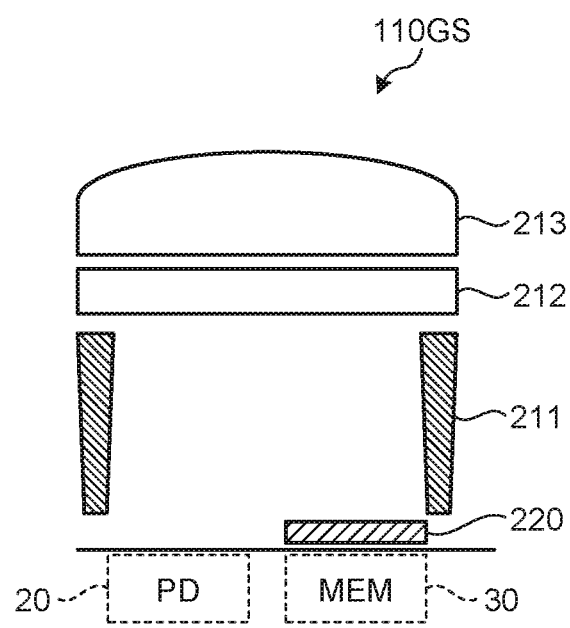
FIG. 4 is a schematic diagram schematically depicting a cross section of the GS pixel applicable to each embodiment in a direction perpendicular to a light receiving surface.

FIG. 4 is a schematic diagram schematically depicting a cross section of the pixel 110GS applicable to each embodiment in a direction perpendicular to a light receiving surface. Note that, in FIG. 4, a configuration of a pixel circuit for driving the PD 20 is omitted.

In the pixel 110GS, the PD 20 and the MEM 30 are disposed, and a light shielding portion 211 for preventing incident light from leaking into an adjacent pixel is provided. In addition, a light shielding portion 220 for preventing incident light from being applied to the MEM 30 is provided for the MEM 30. In the pixel 110GS, a portion of the light receiving surface excluding the region of the MEM 30 serves as an opening on which light involved in photoelectric conversion in the PD 20 is incident.

An optical filter 212 and a lens 213 including, for example, an on-chip lens are provided on the incident side of the pixel 110GS. For example, a filter that transmits light in a predetermined wavelength band in a visible light wavelength band can be applied as the optical filter 212. In an example, a color filter that transmits light in a wavelength band of any of red, green, and blue (hereinafter, referred to as R filter, G filter, and B filter, respectively) can be applied as the optical filter 212. An imaged image in full color can be obtained by appropriately providing the R filter, the G filter, and the B filter on each pixel 110GS in the pixel array section 11 on the basis of, for example, a Bayer array.

Figure 5:
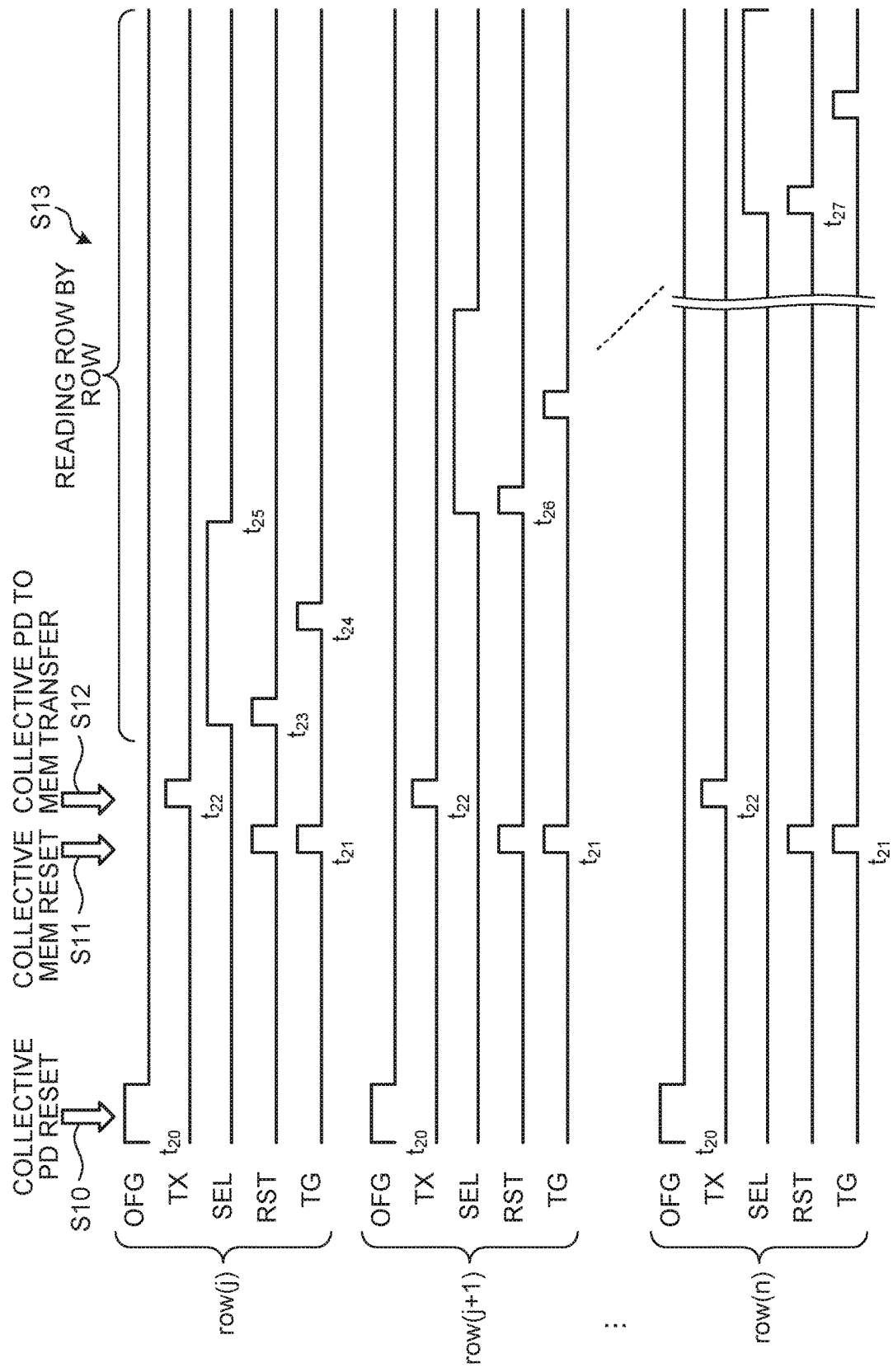
FIG. 5 is an exemplary sequence chart depicting control in the GS pixel applicable to each embodiment.

FIG. 5 is an exemplary sequence chart depicting control in the pixel 110GS applicable to each embodiment. Note that FIG. 5 depicts each of controls of an ith row (row (i)), an (i+1)th row (row (i+1)), . . . , and an nth row (row (n)), which are pixel rows in the pixel array section 11. In addition, the control signals OFG, TX, SEL, RST, and TG are generated for each row by the vertical scanning section 12 under the control of the element control section 19, and are supplied from the pixel signal line 16 of each row to pixels 110 aligned in a row direction.

In the ith to nth rows, the control signals OFG are set to a high level at time $t_{20}$, and the transistor 31 is turned on. Since the other control signals TX, SEL, RST, and TG are set to a low level, the cathode of the PD 20 is connected to the power supply Vdd via the transistor 31, and PDs 20 are reset. Here, the control signals OFG are simultaneously set to the high level in all of the ith to nth rows. The PDs 20 are collectively reset in all the pixels 110GS in the pixel array section 11 (Step S10).

When the PDs 20 are reset by the collective reset in Step S10 and the control signals OFG are set to the low level, exposure is simultaneously started in all the pixels 110GS in the pixel array section 11, and charges obtained by photoelectrically converting light made incident by the exposure are accumulated in the PDs 20.

At time $t_{21}$ after a predetermined time has elapsed from the time $t_{20}$, the control signals TG and RST are set to the high level, and the transistors 21 and 22 are turned on. As a result, one end of the MEM 30 is connected to the power supply Vdd via the transistors 21 and 22, and the MEM 30 is reset. The control signals TG and RST are simultaneously set to the high level in all of the ith to nth rows. The MEMs 30 are collectively reset in all the pixels 110GS in the pixel array section 11 (Step S11).

At time $t_{22}$ after the control signals TG and RST are set to the low level, the control signals TX are set to the high level, and the transistor 32 is turned on. As a result, the exposure ends, and a charge of the PD 20 is transferred to the MEM 30. The control signals TX are simultaneously set to the high level in all of the ith to nth rows. Charges of the PDs 20 are collectively transferred to the MEMs 30 in all the pixels 110GS in the pixel array section 11 (Step S12).

Thereafter, the operations from time $t_{23}$ are sequentially executed in each row of the pixel array section 11. In an example of the ith row, the control signal RST is set to the high level at the time $t_{23}$, and the transistor 22 is turned on. The FD 23 is connected to the power supply Vdd via the transistor 22, and the FD 23 is reset. In addition, the control signal SEL is set to the high level at the time $t_{23}$. As a result, a voltage of a reset level of the FD 23 is supplied to the vertical signal line VSL via the transistors 24 and 25.

At time $t_{24}$ after a predetermined time has elapsed from the time $t_{23}$, the control signal TG is set to the high level, and the transistor 21 is turned on. The control signal SEL is maintained at the high level. As a result, a charge accumulated in the MEM 30 is transferred to the FD 23. Since the control signal SEL is set to the high level and the transistor 25 is turned on, the charge transferred to the FD 23 is converted into a voltage, and transferred to the vertical signal line VSL via the transistors 24 and 25 as a pixel signal.

The control signal SEL is set to the low level at time $t_{25}$ at which a predetermined time has elapsed since time $t_{24}$, and the transistor 25 is turned off.

The control signals RST and SEL are set to the high level at the time $t_{23}$. Operations until the control signal SEL is set to the low level at the time $t_{25}$ are executed row by row in accordance with the timing when the control signal SEL is set to the low level. That is, readings of a pixel signal from each pixel 110GS are executed row by row (Step S13).

In the example of FIG. 5, at time $t_{26}$ immediately after or simultaneously with the time $t_{25}$, at which the control signal SEL is set to the low level in the ith row, in the (i+1)th row adjacent to the ith row, the control signals SEL and RST are set to the high level. The control signal TG is set to the low level after a predetermined time elapses. The control signal SEL is set to the low level after a predetermined time further elapses. This operation is repeated row by row. In the nth row, the control signal SEL is set to the high level at time $t_{27}$ immediately after or simultaneously with the time, at which the control signal SEL is set to the low level in a (n−1)th row adjacent to the nth row.

As described above, in the pixel 110GS, which is the GS pixel, a charge accumulated in the PD 20 by exposure is temporarily transferred to and stored in the MEM 30 (Step S12). Thereafter, a path between the MEM 30 and the PD 20 is disconnected, and the charge stored in the MEM 30 is transferred to the FD 23. Therefore, in the pixel array section 11, exposure can be collectively performed in all rows. As described above, simultaneity is guaranteed for imaging of each row in the pixel array section 11 by using the pixel 110GS, which is the GS pixel.

(Pixel Compatible with Rolling Shutter Method)

Figure 6:
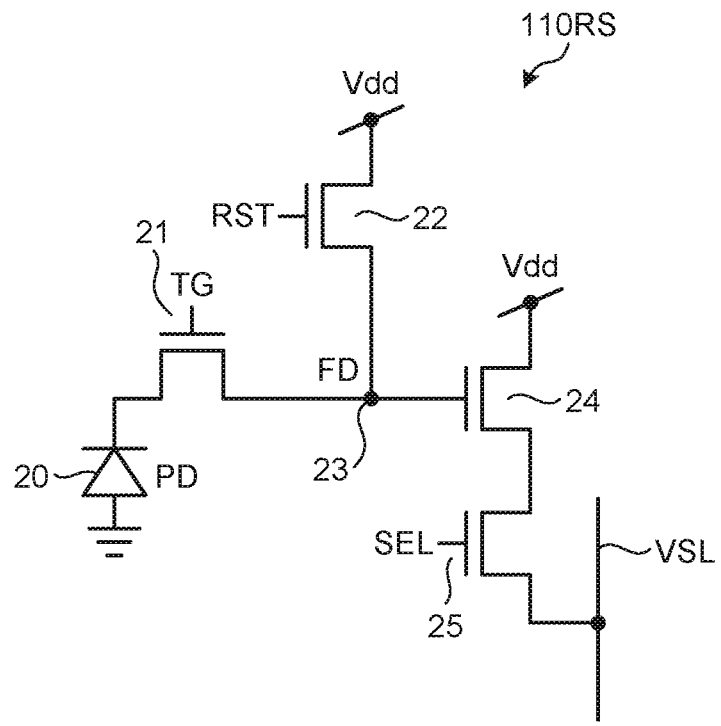
FIG. 6 is a circuit diagram depicting an exemplary configuration of an RS pixel applicable to each embodiment.

FIG. 6 is a circuit diagram depicting an exemplary configuration of a pixel 110RS applicable to each embodiment. The pixel 110RS corresponds to each of the above-described pixels 110, and serves as a second pixel. A pixel 110RS in FIG. 6 has a configuration compatible with a rolling shutter method (hereinafter, RS method). Hereinafter, a pixel having a configuration compatible with the RS method is appropriately referred to as an RS pixel.

In FIG. 6, the pixel 110RS, which is an RS pixel, has a configuration obtained by removing the MEM 30 and the transistors 31 and 32 from the configuration of the pixel 110GS described with reference to FIG. 3. That is, the pixel 110RS includes the PD 20 and four transistors 21, 22, 24, and 25, which are NMOS transistors.

The anode of the PD 20 is connected to, for example, ground potential, and the cathode thereof is connected to the drain of the transistor 21. The source of the transistor 21 is connected to the source of the transistor 22 and the gate of the transistor 24. A power supply Vdd is connected to the drain of the transistor 22. The on/off state of transistor 22 is controlled by a control signal RST supplied from the pixel signal line 16 to the gate. The FD 23 is formed at a connection point between the source of the transistor 21 and the source of the transistor 22. A power supply Vdd is connected to the drain of the transistor 24, and the drain of the transistor 25 is connected to the source thereof. The source of the transistor 25 is connected to a vertical signal line VSL. The on/off state of transistor 25 is controlled by a control signal SEL supplied from the pixel signal line 16 to the gate.

Here, the pixel 110RS is driven by three control signals of the control signals TG, RST, and SEL, and thus three control lines, which are two less than the number of the control lines of the above-described pixel 110GS, are necessary for driving the pixel 110RS.

Figure 7:
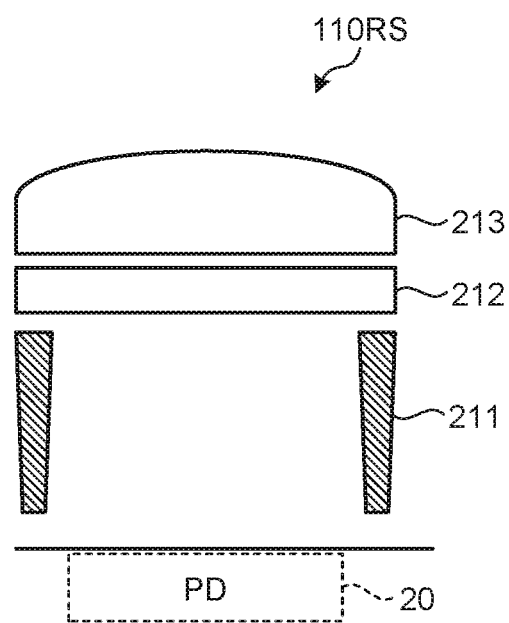
FIG. 7 is a schematic diagram schematically depicting a cross section of the RS pixel applicable to each embodiment in a direction perpendicular to a light receiving surface.

FIG. 7 is a schematic diagram schematically depicting a cross section of the pixel 110RS applicable to each embodiment in a direction perpendicular to a light receiving surface. The pixel 110RS has structure obtained by removing the MEM 30 from the pixel 110GS described with reference to FIG. 4. Note that, in FIG. 7, a configuration of a pixel circuit for driving the PD 20 is omitted.

In the pixel 110GS, the PD 20 is disposed, and a light shielding portion 211 for preventing incident light from leaking into an adjacent pixel is provided. The optical filter 212 and the lens 213 are provided on the incident side of the pixel 110RS. For example, the above-described color filter, that is, each color filter of the R, G, and B filters can be applied to the optical filter 212. The optical filter 212 provided in the pixel 110RS is not limited to the color filter. Although details will be described later, an optical filter for implementing a function different from that of the pixel 110GS can be provided for the pixel 110RS. An infrared (IR)

filter and a colorless (clear) optical filter can be considered as such an optical filter. The IR filter transmits light having a wavelength in an infrared region. The colorless (clear) optical filter transmits light in a wavelength region of the entire visible light wavelength band.

The pixel 110RS has no MEM 30, so that the entire light receiving surface serves as an opening on which light involved in photoelectric conversion in the PD 20 is incident. Therefore, the pixel 110RS can have higher sensitivity than the pixel 110GS whose area of the opening is limited by the MEM 30.

Figure 8:
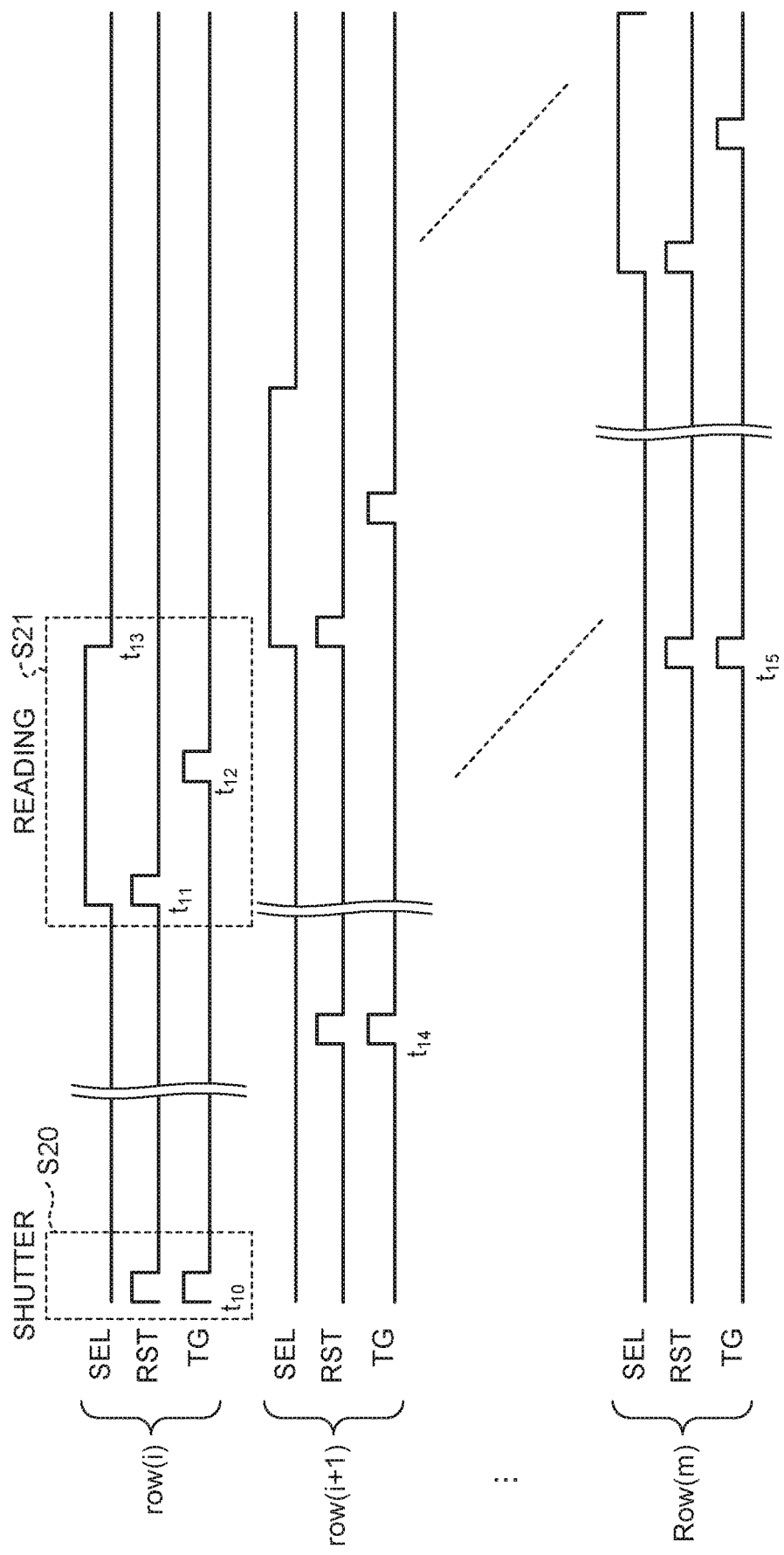
FIG. 8 is an exemplary sequence chart depicting control in the RS pixel applicable to each embodiment.

FIG. 8 is an exemplary sequence chart depicting control in the pixel 110RS applicable to each embodiment. Note that, similarly to FIG. 5 above, FIG. 8 depicts each of controls of the ith row (row (i)), the (i+1)th row (row (i+1)), . . . , and the nth row (row (n)) in the pixel array section 11. In addition, the control signals SEL, RST, and TG are generated for each row by the vertical scanning section 12 under the control of the element control section 19, and are supplied from the pixel signal line 16 of each row to pixels 110 aligned in a row direction.

The sequence chart in FIG. 8 is obtained by removing the controls related to the control signals OFG and TX from the sequence chart of FIG. 5 above. That is, at time $t_{10}$, the control signals TG and RST are set to the high level, and the transistors 21 and 22 are turned on. As a result, the cathode of the PD 20 is connected to the power supply Vdd via the transistors 21 and 22, and the PD 20 is reset. When the control signals RST and TG are set to the low level, exposure starts (shutter operation, Step S20).

At time $t_{11}$ after a predetermined time has elapsed since the time $t_{10}$, the control signal RST is set to the high level, and the transistor 22 is turned on. The FD 23 is connected to the power supply Vdd via the transistor 22, and the FD 23 is reset. In addition, the control signal SEL is set to the high level at the time $t_{11}$. As a result, a voltage of a reset level of the FD 23 is supplied to the vertical signal line VSL via the transistors 24 and 25.

At time $t_{12}$ after a predetermined time has elapsed since the time $t_{11}$, the control signal TG is set to the high level, and the transistor 21 is turned on. At this time $t_{12}$, the exposure ends. In addition, the control signal SEL is maintained at the high level. As a result, a charge accumulated in the PD 20 by the exposure is transferred to the FD 23. Since the control signal SEL is set to the high level and the transistor 25 is turned on, the charge transferred to the FD 23 is converted into a voltage, and transferred to the vertical signal line VSL via the transistors 24 and 25 as a pixel signal (reading operation, Step S21).

The control signal SEL is set to the low level at time $t_{13}$ at which a predetermined time has elapsed since time $t_{12}$, and the transistor 25 is turned off.

The above-described operations from the time $t_{10}$ to $t_{13}$ are executed row by row in accordance with the timing when the control signal SEL is set to the low level. That is, in each pixel 110GR, the operations from the exposure (Step S20) to the reading of a pixel signal (Step S21) are executed row by row. Therefore, when the pixel 110RS, which is an RS pixel, is used, simultaneity regarding imaging of each row in the pixel array section 11 is not guaranteed.

2. Outline of Embodiments of Present Disclosure

As illustrated in FIG. 6, the RS pixel has a simpler circuit configuration than the GS pixel. Meanwhile, since timings of exposure start and end are different for each pixel row to be sequentially accessed, focal plane distortion occurs when a subject moving at high speed is imaged.

In contrast, as described above, the GS pixel has a configuration in which exposure simultaneity is guaranteed. In the configuration of the GS pixel described with reference to FIGS. 3 to 5, the MEM 30 and the PD 20 has a pinned-photodiode configuration. In the configuration, dark current during holding of a charge signal can be reduced, and the PD 20 and the MEM 30 can be completely reset/transferred. The GS pixel is thus commonly used.

In contrast, the GS pixel has a larger number of elements than the RS pixel. In the GS pixel, the area of the opening of the PD 20 is reduced. In addition, the light shielding portion 220 for shielding the MEM 30 from light needs to be provide for inhibiting light leakage (parasitic light sensitivity (PLS)) to the MEM 30 from when charges are collectively transferred from the PD 20 to the MEM 30 to when pixels are sequentially read. The light shielding of the light shielding portion 220 limits a part of light incident on the PD 20. Therefore, the sensitivity/Qs of the GS pixel is generally lower than that of the RS pixel. In addition, the GS pixel has a larger number of control lines for supplying control signals for controlling the GS pixel than the RS pixel, which causes a decrease in yield due to an increase in a wiring defect (short circuit/open) and difficulty in miniaturization of a pixel.

In addition, an imaging element is required to have many functions. For example, use cases as follows are conceivable.

An image surface phase difference pixel (to be described later) and a usual GS pixel are mixed in a pixel row, and the image surface phase difference pixel and the usual GS pixel are independently read.

In imaging a moving image (live view image) serving as assistance of imaging a still image, pixels are thinned out and read.

In these use cases, simultaneity is required in imaging of a main function (for example, imaging of still image), so that the GS pixel is preferably adopted as a main pixel. In contrast, in imaging of a sub-function, a sub-pixel that performs the imaging is required to be capable of being exposed and read at timing independent of the main pixel. In contrast, unlike the main pixel, simultaneity is often unnecessary for the function of the sub-pixel. Thus, if the sub-pixel has a configuration similar to that of the main pixel, the above-described disadvantage of the GS pixel is exhibited.

Consequently, in each embodiment of the present disclosure, two types of pixels are mixed as the pixels 110 constituting the pixel array of the pixel array section 11. One of the two types of pixels is referred to as a main pixel, and the other is referred to as a sub pixel. The main pixel implements a main function, for which the pixel array section 11 is used, in an electronic device mounted with the pixel array section 11, and is used for acquiring a high-quality imaged image, for example. The sub-pixel is used to, for example, perform imaging for assisting a function of the main pixel.

In each embodiment of the present disclosure, the pixel 110GS, which is the GS pixel, is used as the main pixel, and the pixel 110RS, which is the RS pixel, is used as the sub-pixel. The sub-pixel may be optimized in accordance with required characteristics, and a pixel circuit and process conditions (implantation conditions and layer configuration of optical filter/on-chip lens) may be different from those of the main pixel.

In each embodiment of the present disclosure, in a pixel row in which the main pixel and the sub-pixel are mixed, a control line whose function can be shared among a plurality of control lines in the pixel signal line 16 is used in common to the main pixel and the sub-pixel.

3. First Embodiment

Figure 9:
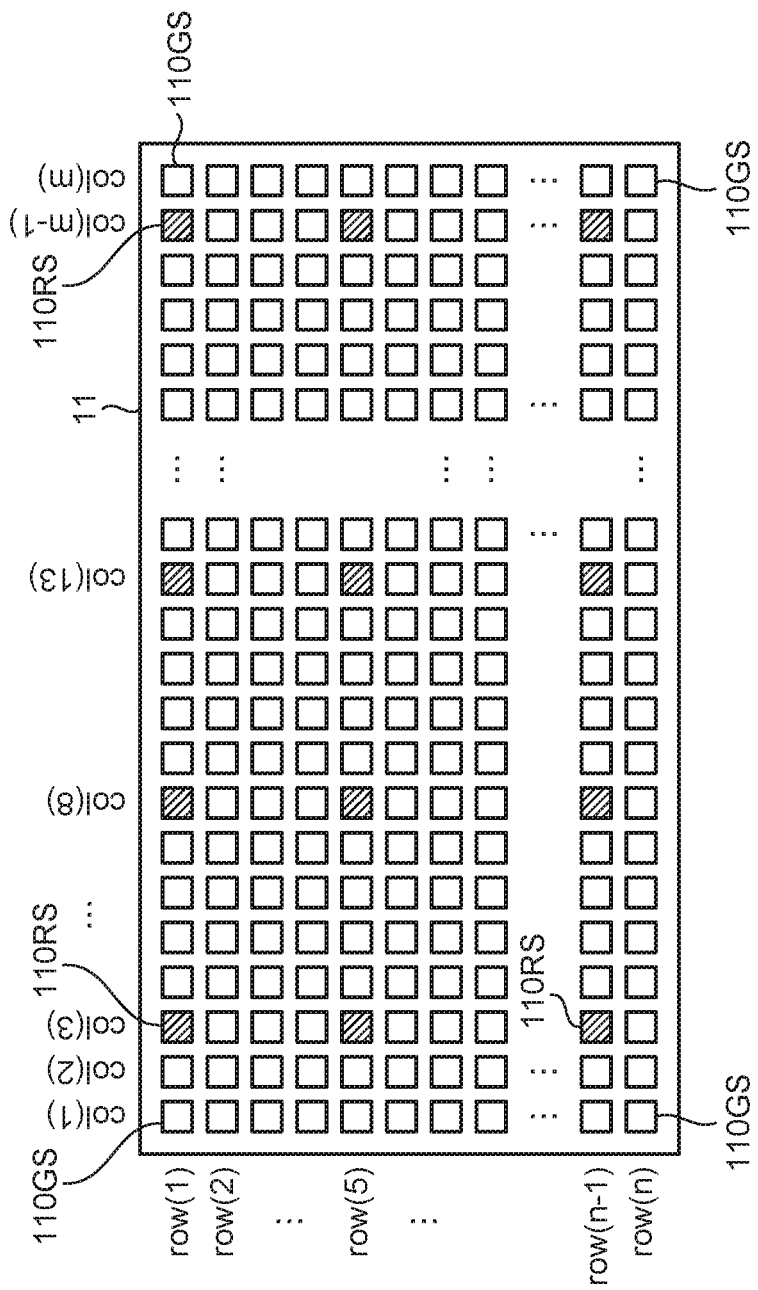
FIG. 9 is a schematic diagram depicting an example of arrangement of a main pixel and a sub-pixel in a pixel array applicable to the first embodiment.

Next, a first embodiment of the present disclosure will be described. FIG. 9 is a schematic diagram depicting an example of the array of main pixels (pixels 110GS) and sub-pixels (pixels 110RS) in the pixel array section 11, applicable to the first embodiment.

In FIG. 9, the horizontal direction corresponds to the row direction, and the vertical direction corresponds to the column direction. In the pixel array section 11, pixels are arranged in an array of matrix of m columns×n rows. An upper end row of the pixel array section 11 is defined as a first row, and a lower end row thereof is defined as an nth row. A left end column is defined as a first column, and a right end column is defined as an mth column. In addition, a row(x) represents an xth row, and a col(x) indicates an xth column.

The density of the sub-pixels in the pixel array section 11 is determined in accordance with the resolution of an imaged image required for imaging performed by the sub-pixels. In a case of a low resolution required for the imaged image of a sub-image, there can be a pixel row in which only the main pixels are arranged and a pixel row in which main pixels and sub-pixels are mixed. In the example of FIG. 9, the pixels 110RS, which are sub-pixels, are arranged every predetermined rows from the first row (first row, fifth row, . . . , and (n−1)th row). In each row, the pixel 110RS are arranged every predetermined columns from the third column (third column, eighth column, thirteenth column, . . . , and (m−1)th column). Pixels 110GS, which are main pixels, are arranged at other positions. That is, the sub-pixels are thinned out and arranged at predetermined intervals in the pixel array section 11.

Figure 10:
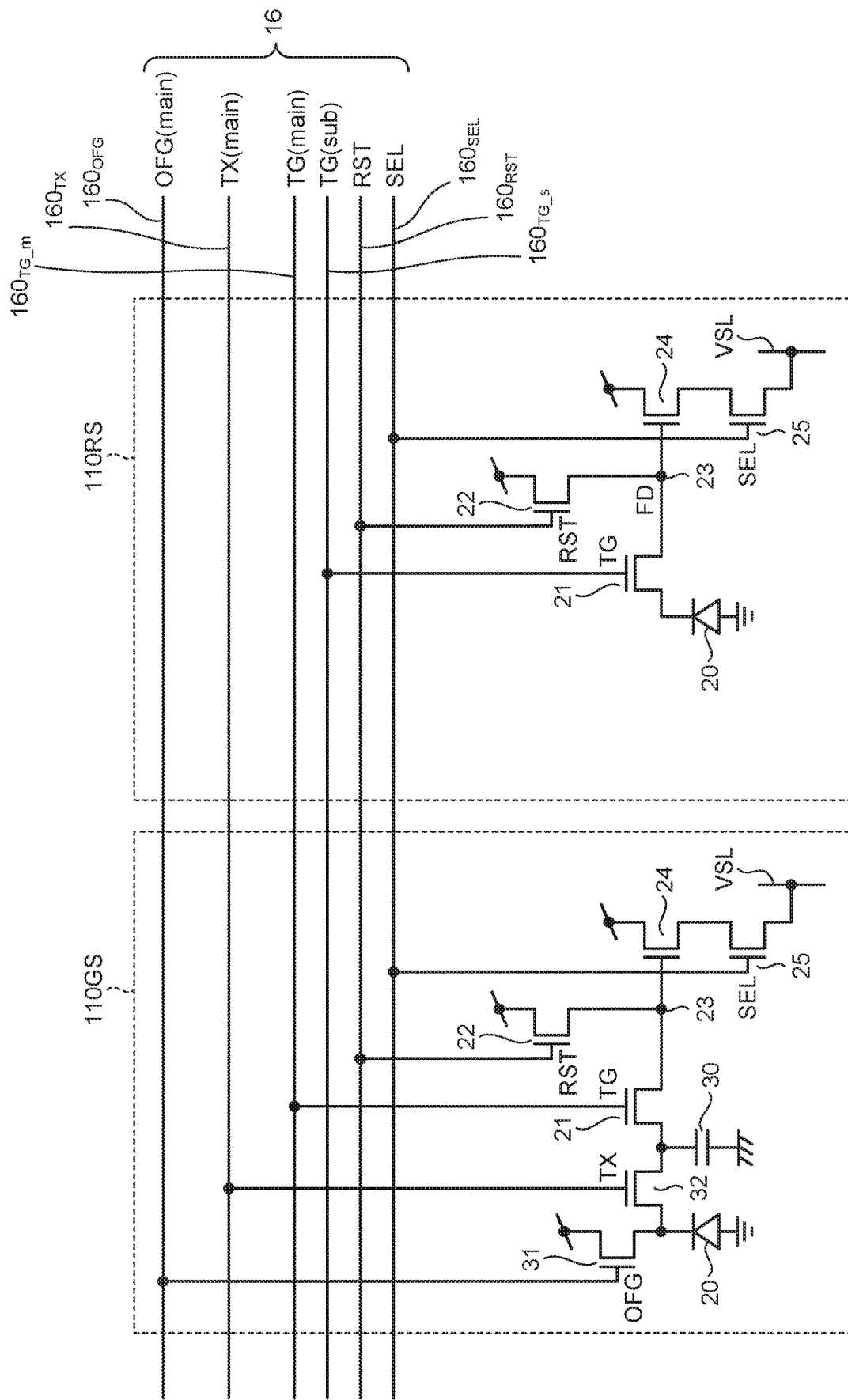
FIG. 10 is an exemplary circuit diagram depicting a configuration example of a pixel signal line according to the first embodiment.

FIG. 10 is an exemplary circuit diagram depicting a configuration example of the pixel signal line 16 according to the first embodiment. In FIG. 10, the pixel signal line 16 is configured as a control line group including a plurality of control lines $160_{OFG}$, $160_{TX}$, $160_{TG\_m}$, $160_{TG\_s}$, $160_{RST}$, and $160_{SEL}$.

The control lines $160_{OFG}$, $160_{TX}$, and $160_{TG\_m}$ among the control lines respectively supply control signals OFG, TX, and TG to the pixel 110GS, which is a main pixel. Gates of the transistors 31, 32, and 21 in the pixel 110GS are connected to control lines $160_{OFG}$, $160_{TX}$, and $160_{TG\_m}$, respectively. In addition, the control line $160_{TG\_s}$ supplies the control signal TG to the pixel 110RS, which is a sub-pixel. The gate of the transistor 21 in the pixel 110RS is connected to the control line $160_{TG\_s}$.

In contrast, the control lines $160_{RST}$ and $160_{SEL}$ respectively supply the control signals RST and SEL to the pixel 110GS and the pixel 110RS in common. The gate of the transistor 22 in the pixel 110GS and the gate of the transistor 22 in the pixel 110RS are connected to the control line $160_{RST}$ in common. Similarly, the gate of the transistor 25 in the pixel 110GS and the gate of the transistor 25 in the pixel 110RS are connected to the control line $160_{SEL}$ in common.

FIG. 11 is a schematic diagram depicting an example of operation in the imaging element 4 according to the first embodiment. In FIG. 11, the horizontal axis represents time, and the vertical axis represents a row of the pixel array section 11. An upper end of the vertical axis corresponds to the first row (row (1)) in the pixel array section 11. The operation in FIG. 11 is executed under the control of the element control section 19 in the imaging element 4 in accordance with an instruction from the overall control section 3, for example.

In the example of FIG. 11, shutter operation (exposure) in the sub-pixel (pixel 110RS) starts from time $t_{30}$. For example, the exposure of the first row is executed from the time $t_{30}$ to time $t_{31}$, and reading is performed at the time $t_{31}$. In the pixel array section 11, the exposures of the pixels 110RS are executed with a predetermined row being thinned out while exposure start and end and reading are executed row by row.

After the end of the exposure and reading of each pixel row in which the pixel 110RS is mixed, exposure and reading of all the pixel rows in the pixel array section 11 are performed. That is, at time $t_{32}$, the PDs 20 are collectively reset in all the pixels 110GS in the pixel array section 11 (Step S10 in FIG. 5). At time $t_{33}$ after a predetermined time has elapsed since the time $t_{32}$, the MEMs 30 are collectively reset, and charges of the PDs 20 are collectively transferred to the MEMs 30 (see Steps S11 and S12 in FIG. 5). Moreover, at the time $t_{33}$, readings from the pixels 110GS are executed row by row (see Step S13 in FIG. 5).

Here, at the time of accessing the pixel 110RS, which is a sub-pixel, from the time $t_{30}$, the control signals OFG, TX, and TG are in a low state in the control lines $160_{OFG}$, $160_{TX}$, and $160_{TG\_m}$ among the control lines related to the pixel 110GS, which is a main pixel. Therefore, exposure and reading processing are not executed in each pixel 110GS, and a pixel signal is selectively read and output from the pixel 110RS.

Similarly, at the time of accessing the pixel 110RS, which is a main pixel, from the time $t_{32}$, the control signal TG is in a low state in the control line $160_{TG\_s}$ among the control lines related to the pixel 110GS, which is a sub-pixel. Therefore, exposure and reading processing are not executed in each pixel 110RS, and a pixel signal is selectively read and output from the pixel 110GS.

Note that the control lines $160_{RST}$ and $160_{SEL}$ are shared by the pixel 110GS and the pixel 110RS. The control signals RST and SEL are supplied in common to the pixel 110GS and the pixel 110RS by these control lines $160_{RST}$ and $160_{SEL}$. When one of the pixel 110GS and the pixel 110RS is accessed, the control signals RST and SEL do not destroy the state of charges accumulated in the PD 20 or the MEM 30 of the other pixel since the transistor 21 of the other pixel is turned off. Therefore, the control lines $160_{RST}$ and $160_{SEL}$ that supply the control signals RST and SEL can be shared by the pixels 110GS and 110RS.

More specifically, in the pixel 110GS or the pixel 110RS, if the transistor 21 is in an off-state, the transistors 22 and 25 are disconnected from the MEM 30 or the PD 20. Therefore, the states of the control signals RST and SEL do not influence the state of charges accumulated in the MEM 30 or the PD 20. In contrast, in the pixel 110GS or the pixel 110RS, even if the transistor 21 is in an on-state, the states of the control signals RST and SEL do not influence reading from the pixel 110GS or the pixel 110RS after the charges accumulated in the MEM 30 or the PD 20 have been transferred.

Therefore, in the pixel 110GS or the pixel 110RS, the control signals RST and SEL for controlling one of the pixel 110GS and the pixel 110RS do not influence the other in a period other than the period from when the transistor 21 has been turned on to when a charge is discharged from the MEM 30 or the PD 20.

FIGS. 12A and 12B are schematic diagrams for illustrating the correspondence relation between FIG. 11 and the above-described sequence charts of FIGS. 5 and 8. FIG. 12A corresponds to the above-described sequence chart of FIG. 5. The collective reset of the PDs 20 at the time $t_{32}$ in FIG. 11 is executed at the same timing in each row as the operation of Step S10. Similarly, the collective transfer of charges of the PDs 20 to the MEM 30 at the time $t_{33}$ is executed at the same timing in each row as the operations of Steps S11 and S12. Moreover, in FIG. 11, reading operations executed row by row from the time $t_{33}$ are executed at timings not overlapping each other for each row as the operation of Step S13.

FIG. 12B corresponds to the above-described sequence of FIG. 8. Note that, here, the sub-pixels (pixels 110RS) are mixed in pixel rows every k rows. In FIG. 11, the exposures started at time $t_{20}$ in the first row are executed row by row at timings not overlapping each other for each row as the operation of Step S20. Similarly, in FIG. 11, reading operations started from the time $t_{31}$ are executed row by row at timings not overlapping each other for each row as the operation of Step S21.

As described above, the five control lines $160_{OFG}$, $160_{TX}$, $160_{TG\_m}$, $160_{RST}$, and $160_{SEL}$ are necessary for driving the pixel 110GS, which is a GS pixel. In addition, three control lines of the control lines $160_{TG\_s}$, $160_{RST}$, and $160_{SEL}$ are necessary for driving the pixel 110RS, which is an RS pixel.

When the pixel 110GS and the pixel 110RS are mixed in one row so as to be independently controlled, the control lines $160_{RST}$ and SEL can be shared by the pixel 110GS and the pixel 110RS. Therefore, a row in which the pixel 110GS and the pixel 110RS are mixed needs six control lines $160_{OFG}$, $160_{TX}$, $160_{TG\_m}$, $160_{TG\_s}$, $160_{RST}$, and $160_{SEL}$, which are less than the total number of control lines for driving the pixel 110GS and the pixel 110RS.

Figure 13:
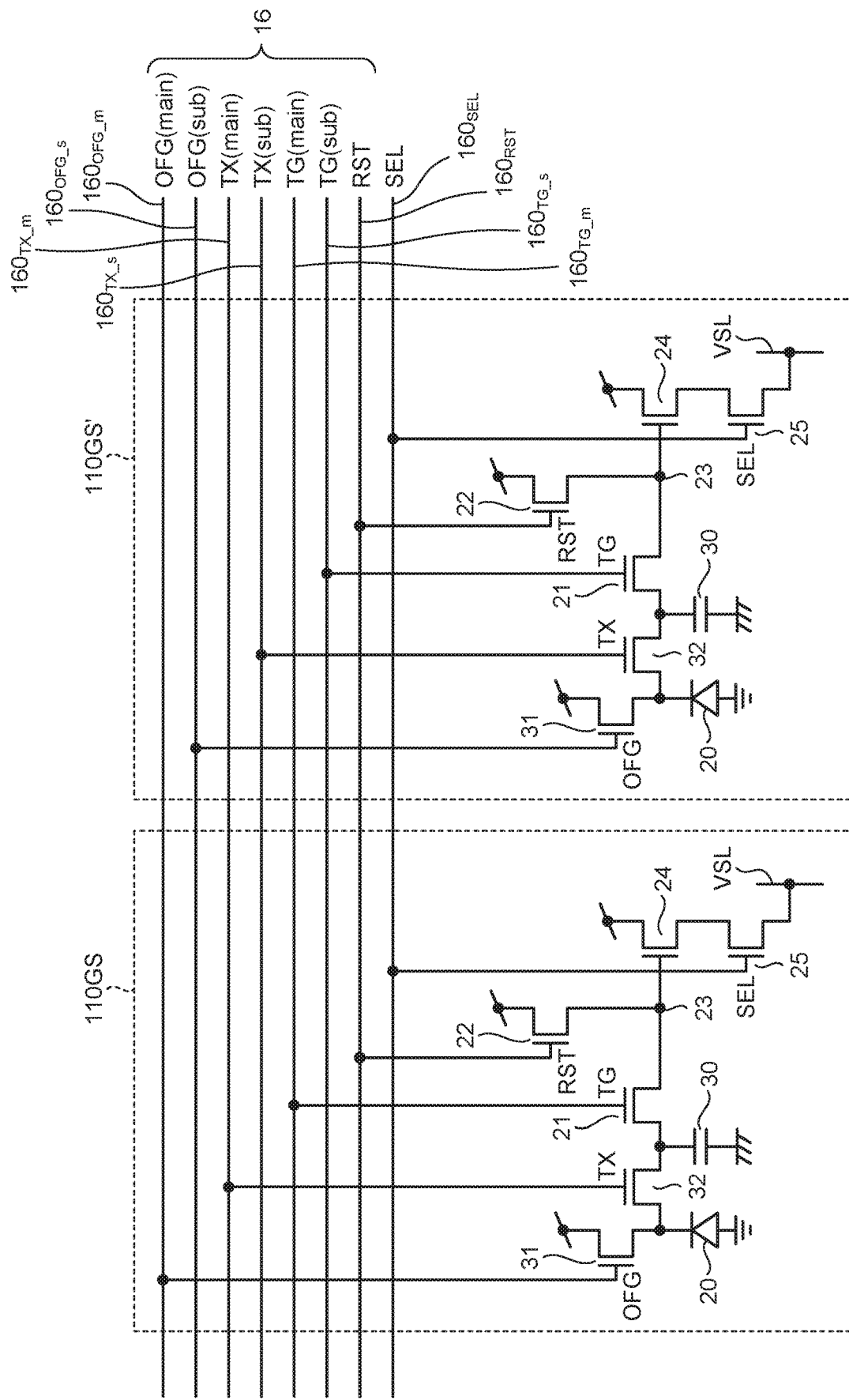
FIG. 13 is an exemplary circuit diagram depicting a configuration example of a pixel signal line in a case where the GS pixel is applied to each of a main pixel and a sub-pixel according to existing technology.

Here, a case where each of the main pixel and the sub-pixel is configured by a GS pixel will be considered. FIG. 13 is an exemplary circuit diagram depicting a configuration example of the pixel signal line 16 in a case where the pixel 110GS, which is a GS pixel, is applied to each of the main pixel and the sub-pixel, according to existing technology. Note that, in FIG. 13, the main pixel is defined as a pixel 110GS, and the sub-pixel is defined as a pixel 110GS' to distinguish between the main pixel and the sub-pixel. In addition, the pixel 110GS and the pixel 110GS' have the same configuration.

When the pixel 110GS and the pixel 110GS' are mixed in the same row and are independently controlled, the control signals RST and SEL can be shared as described above while the control signals OFG, TX, and TG need to be supplied to each of the pixels GS110 and 110GS'. Therefore, in this case, as illustrated in FIG. 13, the pixel signal line 16 includes a total of eight control lines of the control lines $160_{OFG\_m}$, $160_{TX\_m}$, and $160_{TG\_m}$ for the pixel 110GS, the control lines $160_{OFG\_s}$, $160_{TX\_s}$, and $160_{TG\_s}$ for the pixel 110GS', and the control lines $160_{RST}$ and $160_{SEL}$ that can be shared by the pixels 110GS and 110GS'. The number of these control lines is larger than the number (six) of control lines in a case where the pixel 110GS and the pixel 110RS are mixed in one row, according to the first embodiment.

As described above, in the first embodiment, when the main pixel and the sub-pixel are mixed in a pixel row, one of the main pixel and the sub-pixel to be mixed is defined as a GS pixel, and the other is defined as the RS pixel. As a result, the number of control lines in the pixel signal line 16 can be reduced as compared with that in a case where each of the main pixel and the sub-pixel is configured by the GS pixel. Therefore, a decrease in yield due to an increase in a wiring defect can be inhibited, and miniaturization of a pixel can be facilitated.

(Configuration Example in which GS Pixel and RS Pixel are not Mixed in Pixel Row)

Here, a configuration example in which the GS pixel and the RS pixel are not mixed in a pixel row will be described with reference to FIG. 14. FIG. 14 depicts an example in which only the pixels 110GS, which are GS pixels, are arranged in a pixel row. In this case, since the pixels 110GS do not need to be independently controlled, the control signals OFG, TX, TG, RST, and SEL are common to the pixels 110GS. Therefore, the pixel signal line 16 includes only five control lines $160_{OFG}$, $160_{TX}$, $160_{TG}$, $160_{RST}$, and $160_{SEL}$ for supplying the control signals OFG, TX, TG, RST, and SEL.

3-1. First Variation of First Embodiment

Next, a first variation of the first embodiment will be described. In the first variation of the first embodiment, a sub-pixel is used for AF control. Here, a case where an image surface phase difference method is used as the AF control and a sub-pixel is used as a pixel for performing the AF control by the image surface phase difference method (image surface phase difference pixel) will be described.

In the AF control of the image surface phase difference method, distance measurement is performed on the basis of the phase difference of light received by a plurality of pixels, and focus control is executed in accordance with a distance measurement result. In the first variation of the first embodiment, two pixels are paired. The pair of the two pixels include a pixel including a light shielding portion that shields, for example, a left ½ region of a light receiving surface of the pixel from light and a pixel including a light shielding portion that shields a right ½ region of a light receiving surface of another PD 20 from light. Distance measurement is performed on the basis of the phase difference of light received by the two pixels.

Since simultaneity inside a frame of an imaged image is not important in the AF control in the image surface phase difference method, the RS pixel can be used. In addition, since the RS pixel has a larger area of an opening on which light involved in photoelectric conversion in the PD 20 is incident than the GS pixel and can easily have high sensitivity, the RS pixel is preferably used in the AF control.

Figure 15B:
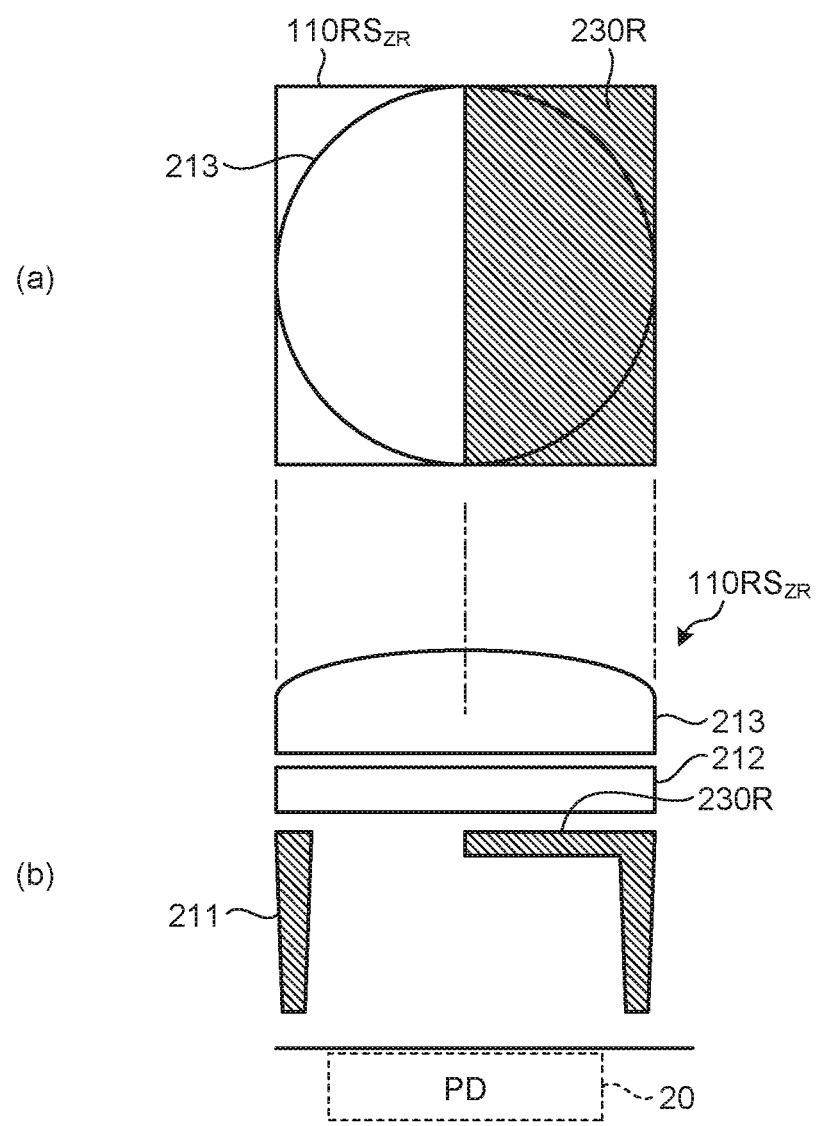
FIG. 15B is a schematic diagram depicting an example of the pixel, in which a light shielding portion shields a ½ region of a light receiving surface from light, applicable to the first variation of the first embodiment.

FIGS. 15A and 15B are schematic diagrams depicting an example of a pixel, in which a light shielding portion shields a ½ region of a light receiving surface from light, applicable to the first variation of the first embodiment. Here, a description will be given by using the pixel 110RS, which is an RS pixel, as an image surface phase difference pixel. FIG. 15A depicts the pixel 110RS whose left ½ region is shielded from light as a pixel $110RS_{ZL}$. FIG. 15B depicts the pixel 110RS whose right ½ region is shielded from light as a pixel $110RS_{ZR}$.

In each of FIGS. 15A and 15B, a section (a) is a top view of the pixels $110RS_{ZL}$ and $110RS_{ZR}$ viewed from a light incident direction. A section (b) is a cross-sectional view schematically depicting a cross section in a direction perpendicular to the light receiving surfaces of the pixels $110RS_{ZL}$ and $110RS_{ZR}$. In this example, a left ½ region of an opening of the pixel $110RS_{ZL}$ is defined as a left light shielding pixel shielded from light by a light shielding portion 230L including metal, for example. A right ½ region of the opening of the pixel $110RS_{ZR}$ is defined as a right light shielding pixel shielded from light by a light shielding portion 230R including metal, for example.

Figure 16:
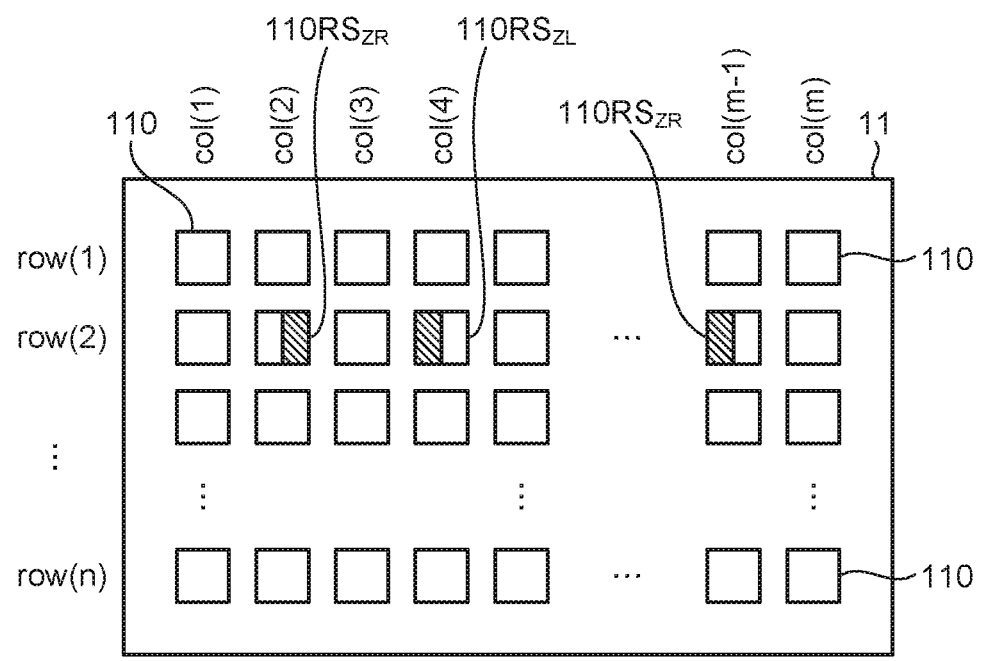
FIG. 16 is a schematic diagram depicting an example of arrangement of RS pixels serving as image surface phase difference pixels in a pixel array, applicable to the first variation of the first embodiment.

FIG. 16 is a schematic diagram depicting an example of arrangement of the pixels $110RS_{ZL}$ and $110RS_{ZR}$ as image surface phase difference pixels in the pixel array section 11, applicable to the first variation of the first embodiment. Each part of the figure has meaning similar to that in FIG. 9 above, and thus the description thereof is omitted here.

In this example, the pixel $110RS_{ZR}$, which is a right light shielding pixel, is arranged in the second column of the second row in the pixel array section 11. The pixel $110RS_{ZL}$, which is a left light shielding pixel, is arranged in the fourth column at a position skipped by one pixel from the second column. As described above, a plurality of pairs of a right light shielding pixel and a left light shielding pixel is arranged in accordance with a predetermined positional relation in a pixel row. A distance to a subject can be determined on the basis of the phase difference of pixel signals read from the right light shielding pixel and the left light shielding pixel.

Note that the circuit described with reference to FIG. 6 can be applied as it is to circuits of the pixels $110RS_{ZL}$ and $110RS_{ZR}$, and thus the description thereof is omitted here.

Figure 17:
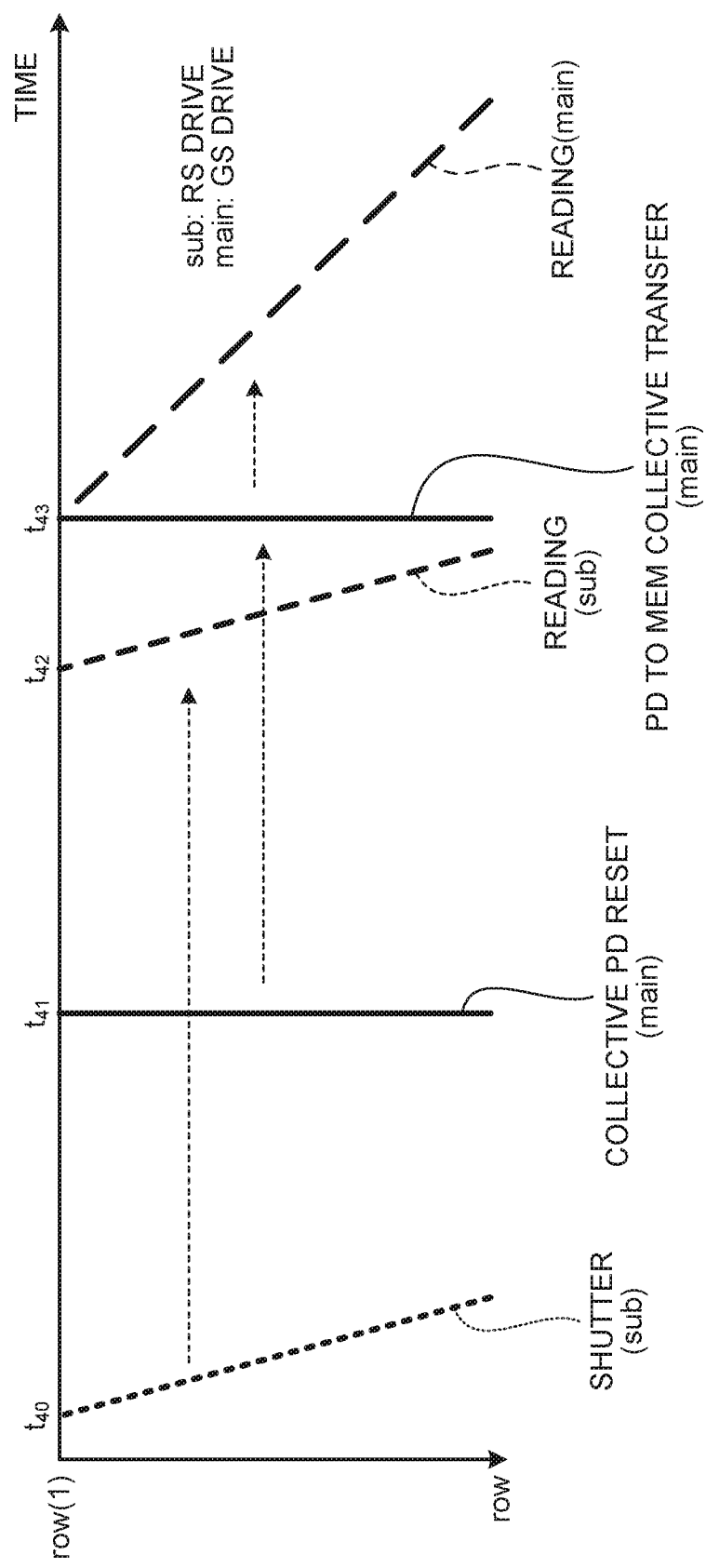
FIG. 17 is a schematic diagram depicting an example of operation in the imaging element according to the first variation of the first embodiment.

FIG. 17 is a schematic diagram depicting an example of operation in the imaging element 4 according to the first variation of the first embodiment. Each part of the figure has meaning similar to that in FIG. 11 above, and thus the description thereof is omitted here. In addition, the operation in FIG. 17 is executed under the control of the element control section 19 in the imaging element 4 in accordance with an instruction from the overall control section 3, for example.

In the example of FIG. 17, the pixels $110RS_{ZL}$ and $110RS_{ZR}$ are exposed for a long time, for example, from exposure start (time $t_{40}$) to reading start (time $t_{42}$) in the first row to improve sensitivity.

In addition, in this example, collective reset of the PDs 20 is executed in the pixel 110GS, which is a main pixel, during an exposure period of the time $t_{40}$ to the time $t_{42}$. At this time, in the pixels $110RS_{ZL}$ and $110RS_{LR}$, the control signal TG is set to a low level during the exposure period, and the transistor 21 is in an off-state. Therefore, the PD 20 is separated from the side of the transistors 22 and 25 that are turned on by the control signals RST and SEL. The collective reset operation of the PDs 20 in the pixel 110GS at time $t_{41}$ does not influence the exposure operations of the pixels $110RS_{ZL}$ and $110RS_{ZR}$.

Similarly, in the pixel 110GS, in a period from when the exposure is started by the collective reset operation of the PDs 20 at the time $t_{41}$ to when the exposure ends at time $t_{43}$, the reading operation is executed in the pixels $110RS_{ZL}$ and $110RS_{ZR}$, and the control signals RST and SEL are set to the high level. Also in this case, in the pixel 110GS, the control signal TG is set to the low level during the exposure period, and the transistor 21 is in the off-state. Therefore, the PD 20 is separated from the side of the transistors 22 and 25 that are turned on by the control signals RST and SEL. The reading operation of the pixels $110RS_{ZL}$ and $110RS_{ZR}$ started at the time $t_{42}$ does not influence the exposure operation of the pixel 110GS.

Here, a phase difference can be detected with higher sensitivity and AF control can be executed with higher accuracy by using an RS pixel having a larger area of an opening than a GS pixel as the image surface phase difference pixel. Light involved in photoelectric conversion performed by the PD 20 is incident on the opening. The detection sensitivity can be further improved by using, for example, a colorless optical filter as the optical filter 212 for the pixels $110RS_{ZL}$ and $110RS_{ZR}$.

Note that a method of the AF control performed by using sub-pixels is not limited to the above-described image surface phase difference method. For example, contrast AF can be performed by using the sub-pixel. In the contrast AF, AF control is performed on the basis of the contrast of an imaged image. In the contrast AF, the distance between the imaging element 4 and a focus lens in the optical system 2 is changed to search for the distance in focus on the basis of the imaged image.

3-2. Second Variation of First Embodiment

Next, a second variation of the first embodiment will be described. Similarly to the above-described first variation, in the second variation of the first embodiment, a sub-pixel (RS pixel) is used as an image surface phase difference pixel in a case where an image surface phase difference method is adopted as AF control. In this case, in the second variation, the sub-pixel used as an image surface phase difference pixel includes two photoelectric conversion elements in one pixel.

Hereinafter, a pixel including two photoelectric conversion elements is appropriately referred to as a 2PD pixel. In addition, an RS pixel having the configuration of the 2PD pixel will be described as a pixel $110RS_{2PD}$.

Figure 18A:
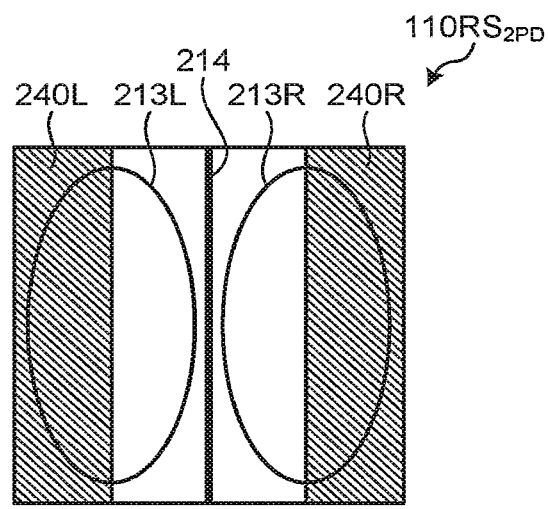
FIGS. 18A and 18B are schematic diagrams depicting an exemplary configuration of the RS pixel serving as a 2PD pixel applicable to the second variation of the first embodiment.
Figure 18B:
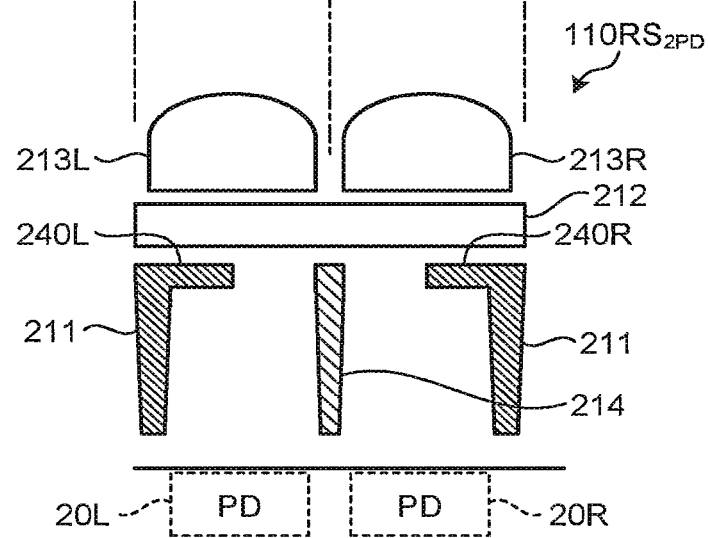

FIGS. 18A and 18B are schematic diagrams depicting an exemplary configuration of the pixel 110RS2PD applicable to the second variation of the first embodiment. In FIGS. 18A and 18B, FIG. 18A is a top view of the pixel 110RS2PD viewed from a light incident direction. FIG. 18B is a cross-sectional view schematically depicting a cross section in a direction perpendicular to the light receiving surface of the pixel 110RS2PD.

In this example, as illustrated in FIG. 18B, the pixel 110RS2PD is separated into a left portion and a right portion of the pixel by a light shielding portion 214. A PD 20L and a PD 20R are provided in the left portion and the right portion, respectively. In addition, light shielding portions 240L and 240R including, for example, metal shield, from light, the light receiving surface of the left portion on the left ½ side and the light receiving surface of the right portion on the right ½ side, respectively. The left portion functions as a left light shielding pixel. The right portion functions as a right light shielding pixel. In addition, as illustrated in FIG. 18A, lenses 213L and 213R are provided in the left portion and the right portion, respectively.

Light incident on the pixel $110RS_{2PD}$ is incident on the PDs 20L and 20R through the lenses 213L and 213R and openings formed by the light shielding portions 214L and 214R. A distance to a subject is determined on the basis of the phase difference of pixel signals from the PDs 20L and 20R. That is, the 2PD pixel alone can implement a function of both the above-described left light shielding pixel and right light shielding pixel.

Figure 19:
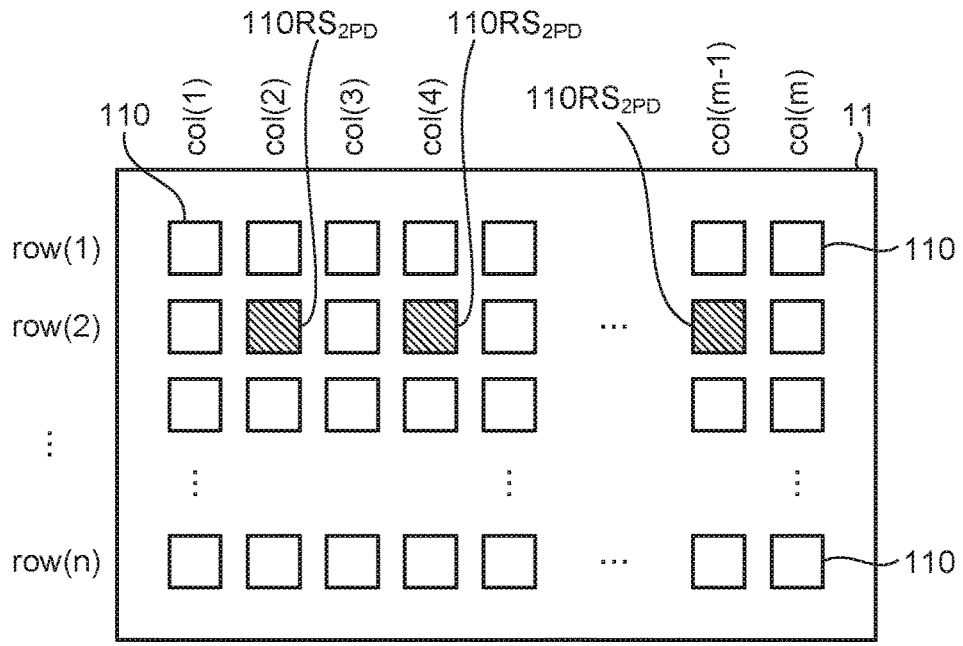
FIG. 19 is a schematic diagram depicting an example of arrangement of RS pixels serving as 2PD pixels in a pixel array, applicable to a second variation of the first embodiment.

FIG. 19 is a schematic diagram depicting an example of arrangement of RS pixels serving as 2PD pixels in a pixel array, applicable to the second variation of the first embodiment. In the example of FIG. 19, pixels $110RS_{2PD}$ are arranged in the second column, the fourth column, and the (m−1)th column of the second row in the pixel array section 11. As described above, the 2PD pixel alone can implement the function of both the left light shielding pixel and the right light shielding pixel, so that the density of image surface phase difference pixels can be increased as compared with that in a case where the left light shielding pixel and the right light shielding pixel are used.

Figure 20:
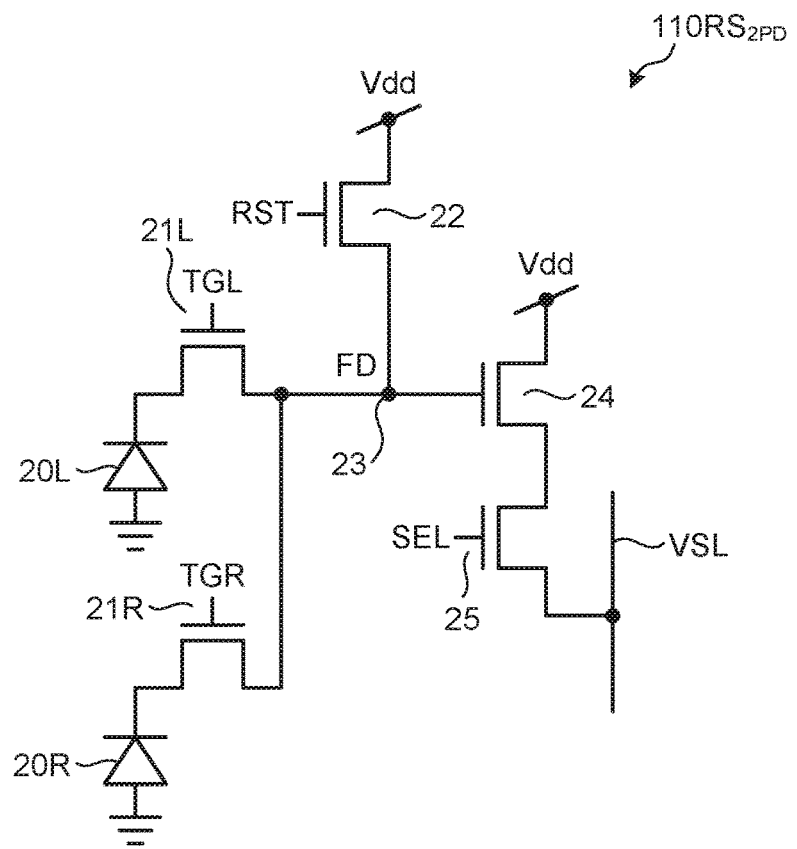
FIG. 20 is a circuit diagram depicting an exemplary configuration of the RS pixel according to the second variation of the first embodiment.

FIG. 20 is a circuit diagram depicting an exemplary configuration of the pixel 110RS$_{2PD}$ according to the second variation of the first embodiment. As illustrated in FIG. 20, the pixel 110RS$_{2PD}$ includes two PDs of the PD 20L and the PD 20R. The PDs 20L and 20R are connected to the FD 23 via transistors 21L and 21R, respectively. The on/off states of the transistors 21L and 21R are controlled by control signals TGL and TGR, respectively. Exposure and reading performed by the PD 20L and exposure and reading performed by the PD 20R can be independently executed by exclusively controlling the on/off states of the transistors 21L and 21R with the control signals TGL and TGR.

Note that, since exclusive control is performed by the control signals TGL and TGR, a control line for supplying the control signal TGL and a control line for supplying the control signal TGR are not shared. Therefore, the number of control lines included in the pixel signal line 16 in a pixel row in which the pixel 110GS and the pixel 110RS$_{2PD}$ are mixed is, for example, one more than the number described with reference to FIG. 10.

The operation described with reference to FIG. 11 can be applied to the exposure and reading operations of the pixel 110RS$_{2PD}$. In this case, for example, the operation from the exposure start at the time $t_{30}$ to the reading at the time $t_{31}$ in FIG. 11 is executed twice on the PD 20L and the PD 20R.

3-3. Third Variation of First Embodiment

Next, a third variation of the first embodiment will be described. In the third variation of the first embodiment, a sub-pixel (RS pixel) is used for movement detection.

For example, referring to FIG. 1, the image processing section 5 sets a region of interest (ROI) for an imaged image output from the imaging element 4, detects movement in the region of interest by using pixel signals from the sub-pixel, and notifies the overall control section 3 of a detection result. When the given detection result indicates that movement has been detected, the overall control section 3 instructs the imaging element 4 to switch imaging from imaging using a sub-pixel to imaging using a main pixel. In response to this instruction, the imaging element 4 switches imaging from the imaging using a sub-pixel to imaging using a main pixel (GS pixel).

Figure 21:
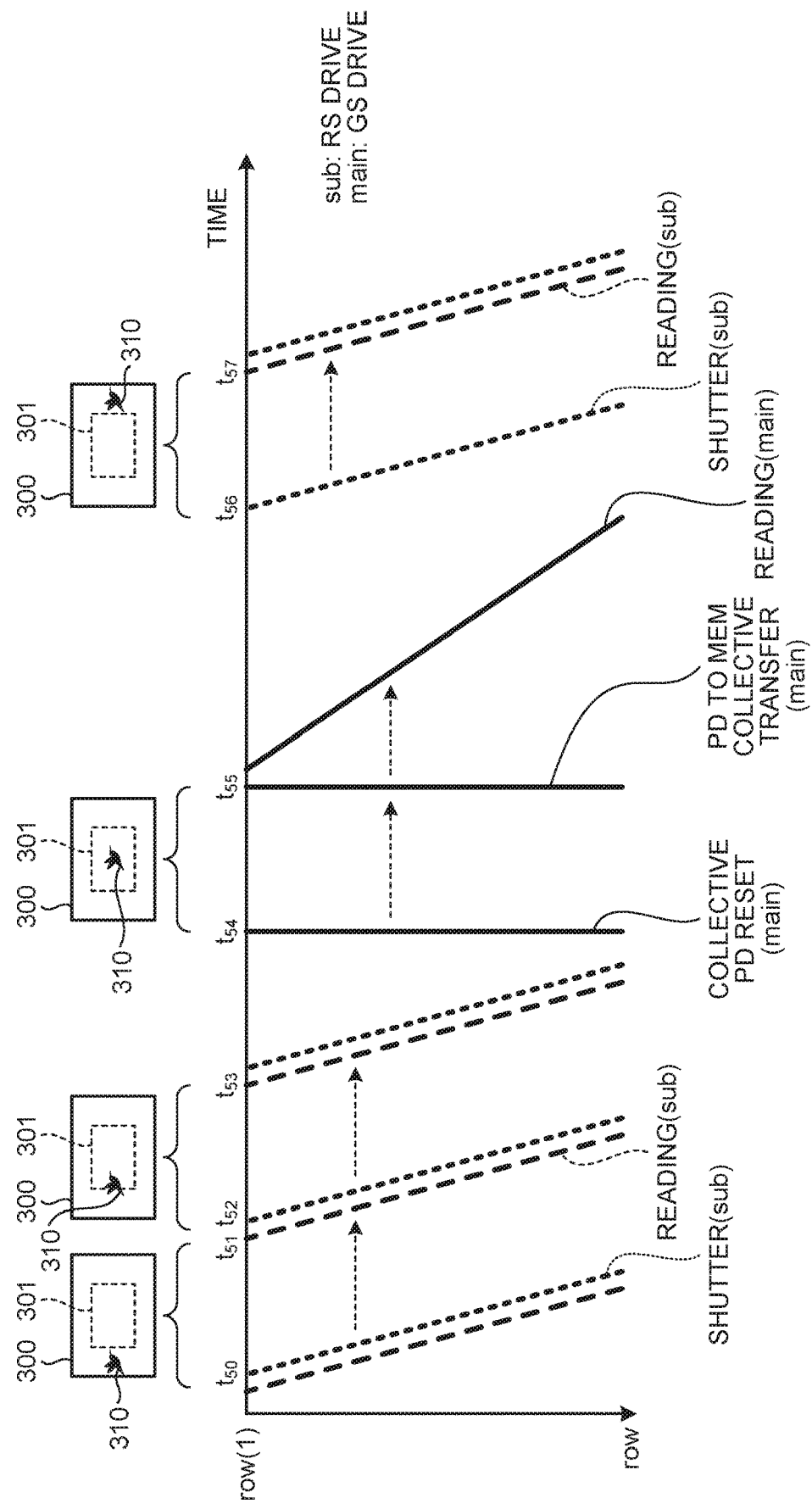
FIG. 21 is a schematic diagram depicting an example of operation in an imaging element according to a third variation of the first embodiment.

FIG. 21 is a schematic diagram depicting an example of operation in the imaging element 4 according to the third variation of the first embodiment. The operation in FIG. 21 is executed under the control of the element control section 19 in the imaging element 4 in accordance with an instruction from the overall control section 3, for example.

Note that, for example, the arrangement described with reference to FIG. 9 can be applied to arrangement of a main pixel and a sub-pixel in the pixel array section 11, and thus the description thereof is omitted here. Note that sub-pixels are arranged at a density in which movement detection is possible. In addition, the pixel 110RS described with reference to FIGS. 6 to 8 and the pixel 110GS described with reference to FIGS. 3 to 5 can be applied as they are to the sub-pixel and the main pixel, respectively, and thus the description thereof is omitted here.

In FIG. 21, a section (a) schematically depicts an imaging region 300 and a region of interest 301. In the imaging region 300, the imaging element 4 performs imaging. The region of interest 301 is set in the imaging region 300. The image processing section 5 sets the region of interest 301 as a region in an imaged image of one frame in accordance with an instruction from the overall control section 3. In addition, FIG. 21 depicts an example in which the imaging region 300 includes a subject image 310.

In FIG. 21, a section (b) is a schematic diagram depicting an example of operation in the imaging element 4 according to the third variation of the first embodiment. Each part of the figure has meaning similar to that in FIG. 11 above, and thus the description thereof is omitted here. In addition, in the following description, exposure and reading operations executed row by row from the first row will be represented by the operation in the first row.

In the example of FIG. 21, for example, in the first row, the pixel 110RS is exposed during a period of times $t_{50}$ to $t_{51}$, and reading is executed at the time $t_{51}$ when the exposure ends. Exposure is performed during a period of times $t_{52}$ to $t_{53}$ corresponding to the timing when the reading of the first row has ended, and reading is executed at time $t_{54}$ when the exposure ends. The exposure and reading operations are repeated at predetermined time intervals. The time interval at which the operations are repeated may be, for example, a frame rate such as 30 frame per second (fps) and 60 fps, or may be an interval of several seconds.

In this example, as illustrated in the section (a), the subject image 310 is included outside the region of interest 301 in the imaging region 300 during the period of times $t_{50}$ to $t_{51}$, and the subject image 310 falls on the region of interest 301 during the next period of times $t_{52}$ to $t_{53}$. Note that the image processing section 5 can track the same subject image 310 in each imaging by pattern matching, image recognition processing, or the like.

For example, from seeing that the subject image 310 positioned on the outside of the region of interest 301 during the times $t_{50}$ to $t_{51}$ falls on the region of interest 301 during the times $t_{52}$ to $t_{53}$ after the time $t_{51}$, the overall control section 3 determines that the subject image 310 is moving into the region of interest 301. On the basis of the determination, the overall control section 3 instructs the imaging element 4 to switch the imaging operation from imaging operation using the pixel 110RS to the imaging operation using the pixel 110GS.

In the imaging element 4, in accordance with the instruction, the element control section 19 executes collective reset of the PDs 20 and starts exposure of the pixel 110GS at time $t_{54}$. The element control section 19 executes collective reset of the MEMs 30 and collective transfer of charges from the PDs 20 to the MEMs 30 at time $t_{55}$. The element control section 19 executes reading of a transmission signal from the pixel 110GS at the time $t_{55}$. The element control section 19 executes these operations row by row. When the reading ends in all the rows, the overall control section 3 switches the imaging operation from the imaging operation using the pixel 110GS to the imaging operation using the pixel 110RS. In the example of FIG. 21, exposure is performed during a period of times $t_{56}$ to $t_{57}$, and reading is executed at the time $t_{57}$ when the exposure ends.

In the third variation of the first embodiment, the pixel 110RS capable of having higher sensitivity than the pixel 110GS is used for performing imaging for the movement detection. Therefore, movement detection can be executed with higher accuracy. In addition, the pixels 110RS for performing movement detection are thinned out and arranged in a predetermined manner in the pixel array section 11. Therefore, a load of movement detection processing in the image processing section 5 can be inhibited, and an increase in speed and decrease in power consumption are made possible.

Note that, in the third variation of the first embodiment, the subject image 310 falling on the region of interest 301 switches the imaging operation from the imaging operation using the pixel 110RS to the imaging operation using the pixel 110GS. In addition, when the reading of the pixel 110GS ends, the imaging operation is switched from the imaging operation using the pixel 110GS to the imaging operation using the pixel 110RS. Therefore, the control signals RST and SEL supplied to one of the pixel 110GS and the pixel 110RS via the control lines $160_{RST}$ and $160_{SEL}$, which are shared by the pixels 110GS and 110RS, do not influence the operation of the other pixel.

3-4. Fourth Variation of First Embodiment

Next, a fourth variation of the first embodiment will be described. In the fourth variation of the first embodiment, a sub-pixel (RS pixel) is used for capturing a moving image to be displayed on the display section 8. In this case, a moving image captured by the sub-pixel is a so-called live view image used as assistance of capturing of an imaged image (for example, still image) performed by a main pixel.

Figure 22:
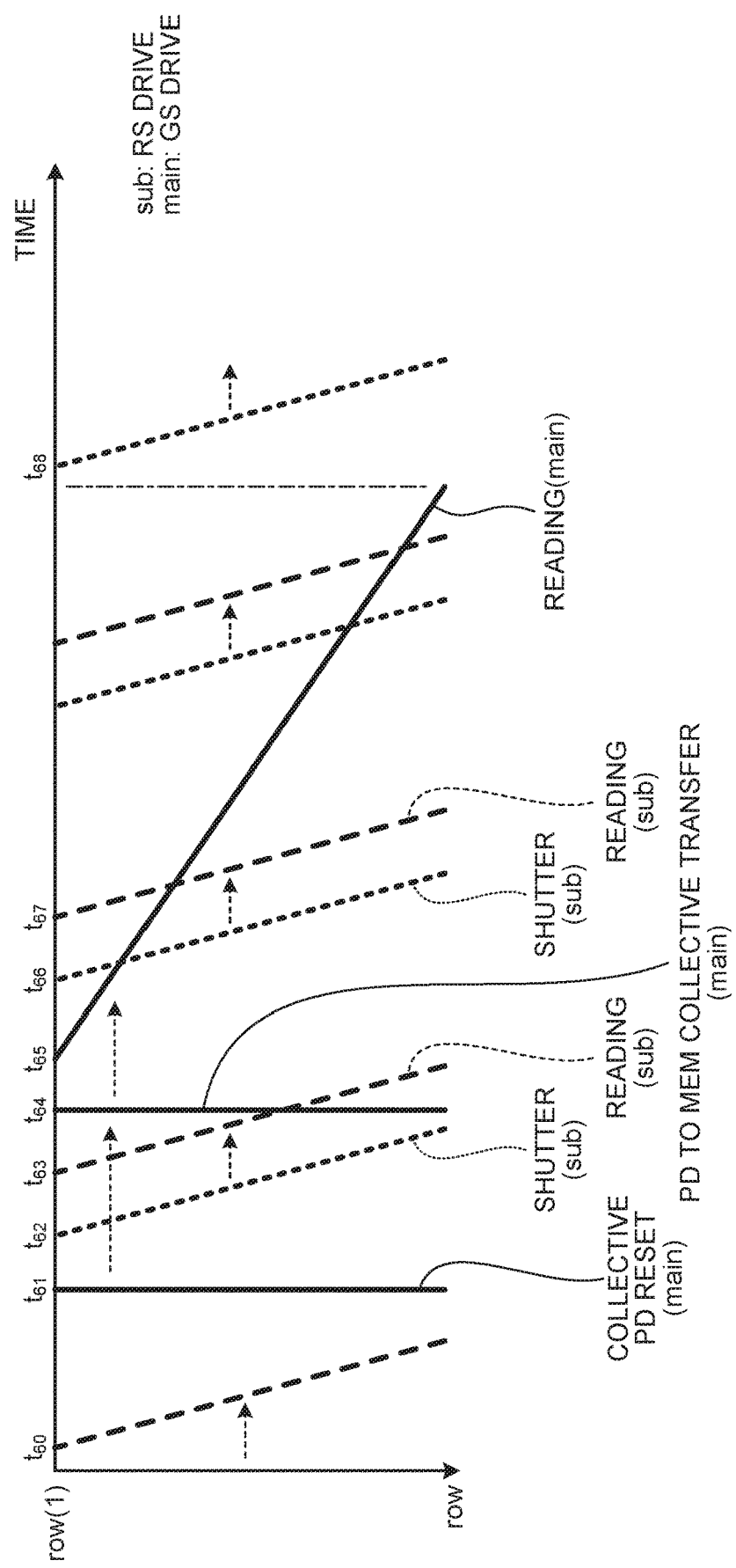
FIG. 22 is a schematic diagram depicting an example of operation in an imaging element according to a fourth variation of the first embodiment.

FIG. 22 is a schematic diagram depicting an example of operation in the imaging element 4 according to the fourth variation of the first embodiment. The operation in FIG. 22 is executed under the control of the element control section 19 in the imaging element 4 in accordance with an instruction from the overall control section 3, for example. Note that each part of the figure has meaning similar to that in FIG. 11 above, and thus the description thereof is omitted here. In addition, in the following description, exposure and reading operations executed row by row from the first row will be represented by the operation in the first row.

Note that, for example, the arrangement described with reference to FIG. 9 can be applied to arrangement of a main pixel and a sub-pixel in the pixel array section 11, and thus the description thereof is omitted here. Note that sub-pixels are arranged on the display section 8 at a density in which the sub-pixels can be used as imaging assistance of a still image. In addition, the pixel 110RS described with reference to FIGS. 6 to 8 and the pixel 110GS described with reference to FIGS. 3 to 5 can be applied as they are to the sub-pixel and the main pixel, respectively, and thus the description thereof is omitted here.

In the fourth variation of the first embodiment, imaging is continuously executed by the pixel 110RS, which is a sub-pixel. In the example of FIG. 22, exposure of the pixel 110RS is performed during a period of times $t_{62}$ to $t_{63}$, and reading is executed at time $t_{63}$. As a result, a moving image of one frame is acquired. After the reading at the time $t_{63}$ ends, exposure of the pixel 110RS is performed during a period of times $t_{66}$ to $t_{67}$. Reading is executed at time $t_{67}$. A moving image of the next frame is acquired. Thereafter, similarly, exposure and reading of the pixel 110RS are repeatedly executed at predetermined time intervals (for example, frame time intervals).

In contrast, the operation of the pixel 110GS, which is a main pixel, is executed at timing in accordance with a shutter operation of a user, for example. In the example of FIG. 22, the overall control section 3 instructs the imaging element 4 to execute imaging with the pixel 110GS in response to, for example, a shutter operation of the user. In the imaging element 4, in accordance with the instruction, the element control section 19 executes collective reset of the PDs 20 and starts exposure of the pixel 110GS at time $t_{61}$. The element control section 19 executes collective reset of the MEMs 30 and collective transfer of charges from the PDs 20 to the MEMs 30 at time $t_{64}$. The element control section 19 executes reading of a transmission signal from the pixel 110GS at time $t_{65}$. The element control section 19 executes these operations row by row. The series of operations of the pixel 110GS is executed in parallel with the imaging operation of the pixel 110RS.

Note that the element control section 19 can adjust, for example, reading timing of the pixel 110GS or the operation of the pixel 110RS such that timing when the control signals RST and SEL are set to a high level by an operation of the pixel 110RS is not included in a period from when the control signal TG is set to the high level and the transistor 21 is turned on to when a charge is discharged from the MEM 30 in the reading operation of the pixel 110GS.

As described above, in the fourth variation of the first embodiment, a moving image used for the live view is generated by pixel signals of the pixels 110RS thinned out and arranged in a predetermined manner in the pixel array section 11. Therefore, an increase in speed of processing and a decrease in power consumption are made possible.

4. Second Embodiment

Next, a second embodiment of the present disclosure will be described. The second embodiment is an example of a case where a FD 23 is shared by pixels (pixels 110GS or pixel 110GS and pixel 110RS) arranged in adjacent rows.

Figure 23:
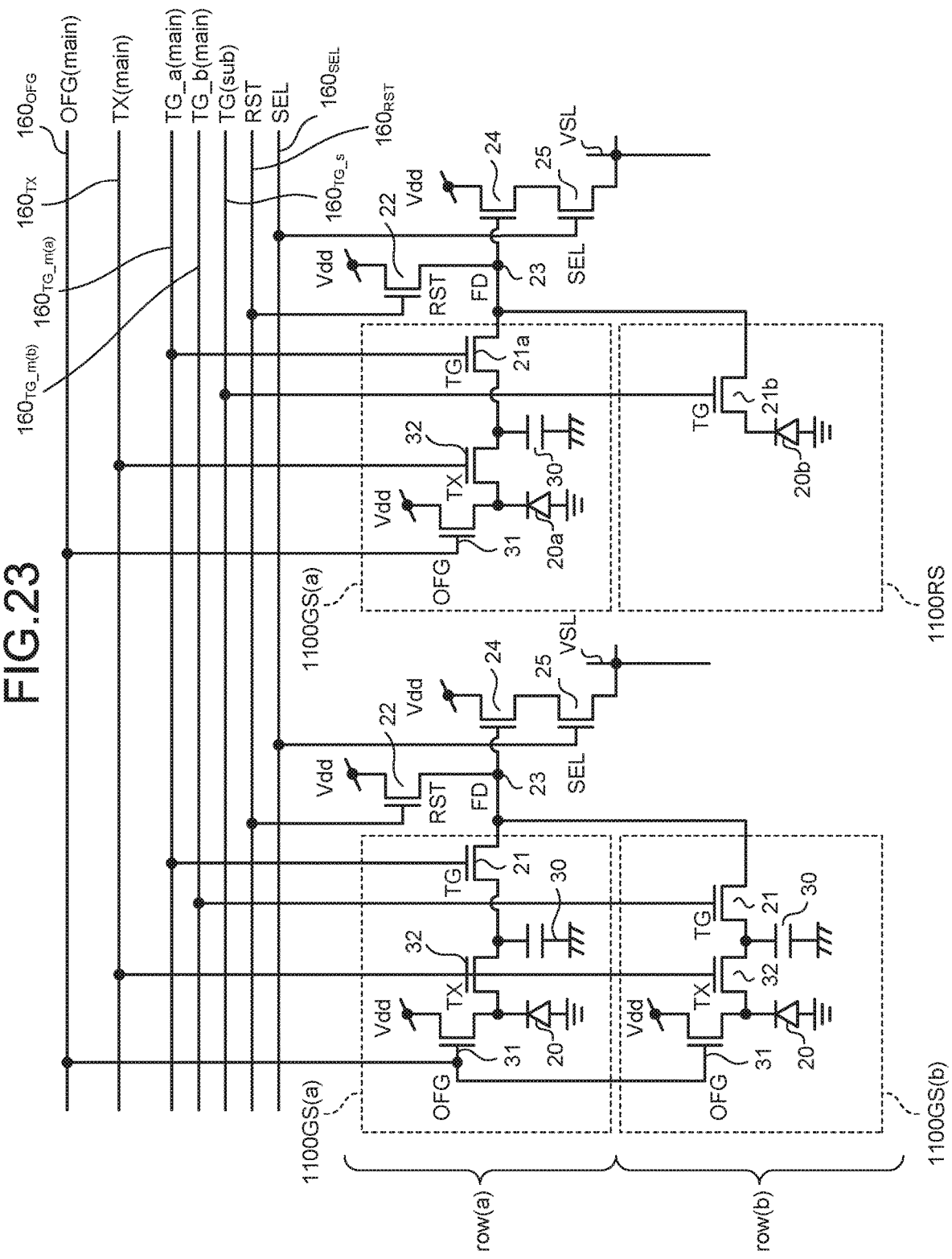
FIG. 23 is an exemplary circuit diagram depicting a configuration example of a pixel signal line according to a second embodiment.

FIG. 23 is an exemplary circuit diagram depicting a configuration example of a pixel signal line according to the second embodiment. In FIG. 23, a circuit 1100GS(a) and a circuit 1100RS share a transistor 22, the FD 23, a transistor 24, and a transistor 25.

That is, the circuit 1100GS(a) is arranged in the ath row, includes a PD 20a, a transistor 21a, a MEM 30, a transistor 31, and a transistor 32, and further includes the transistor 22, the FD 23, the transistor 24, and the transistor 25, thereby forming a pixel 110GS, which is a main pixel. The circuit 1100RS is arranged in the same column as the circuit 1100GS(a) in the bth row adjacent to the ath row. Similarly to the circuit 1100GS, the circuit 1100RS includes a PD 20b and a transistor 21b, and further includes the transistor 22, the FD 23, the transistor 24, and the transistor 25, thereby forming the pixel 110RS, which is a sub-pixel.

Moreover, a circuit 1100GS(b) arranged in the bth row has a configuration equivalent to that of the circuit 1100GS(a), and shares the transistor 22, the FD 23, the transistor 24, and the transistor 25 with a pixel 1100GS(a) arranged in the same column as the pixel 1100GS(b) in the adjacent row.

That is, in the example of FIG. 23, the sub-pixel and the main pixel are mixed in the bth row.

In this case, a pixel signal line 16 includes control lines $160_{OFG}$ and $160_{TX}$ that supply control signals OFG and TX for controlling the circuits 1100GS(a) and 1100GS(b) of the ath row in common. The pixel signal line 16 further includes a control line $160_{TG\_m(a)}$ and a control line $160_{TG\_m(b)}$. The control line $160_{TG\_m(a)}$ supplies a control signal TG_a for controlling the circuit 1100GS(a) of the ath row. The control line $160_{TG\_m(b)}$ supplies a control signal TG_b for controlling the circuit 1100GS(b) of the bth row. Furthermore, the pixel signal line 16 includes a control line $160_{TG\_s}$ and control lines $160_{RST}$ and $160_{SEL}$. The control line $160_{TG\_s}$ supplies a control signal TG for controlling the circuit 1100RS. The control lines $160_{RST}$ and $160_{SEL}$ respectively supply control signals RST and SEL to each circuit in common. That is, the pixel signal line 16 includes seven control lines.

Figure 24:
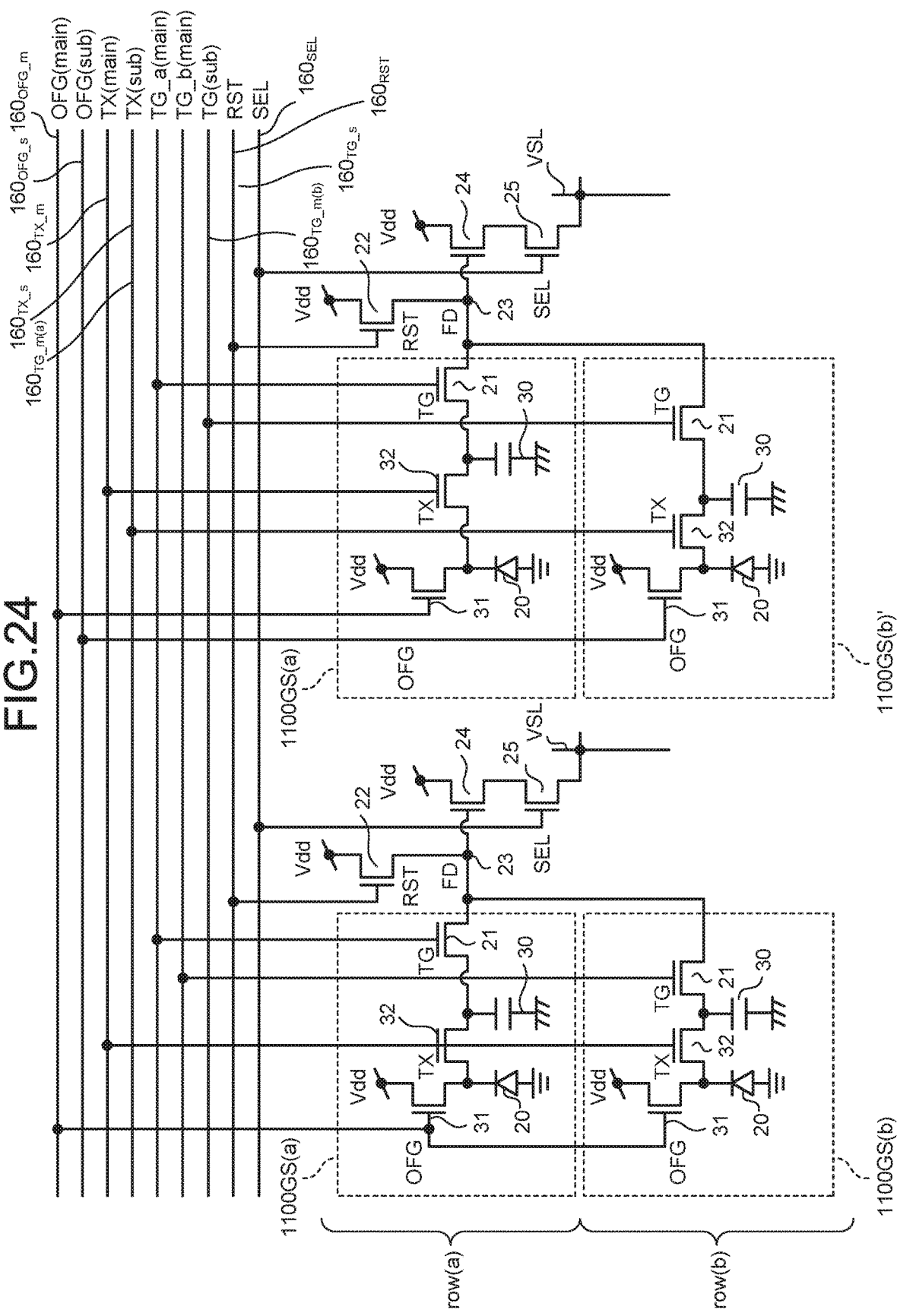
FIG. 24 is an exemplary circuit diagram depicting a configuration example of a pixel signal line in a case where the configuration of the GS pixel is applied as a sub-pixel in an example in which an FD is shared in adjacent rows.

FIG. 24 is an exemplary circuit diagram depicting a configuration example of a pixel signal line in a case where the configuration of a GS pixel is applied as a sub-pixel in an example in which the FD 23 is shared in adjacent rows. In FIG. 24, a circuit 1100GS(b)' has a configuration equivalent to that of the circuit 1100GS(a), and shares the transistor 22, the FD 23, the transistor 24, and the transistor 25 with the circuit 1100GS(a) arranged in the same column as the circuit 1100GS(b)' in the adjacent row. Also in the example of FIG. 24, the sub-pixel and the main pixel are mixed in the bth row.

In this case, the circuit 1100GS(b)' serving as a sub-pixel needs to be capable of independently controlling the pixel 1100GS(b) serving as a main pixel in the same row. Therefore, in order to control the circuit 1100GS(b)', it is necessary to supply the control signal TG and further supply the control signals OFG and TX. Therefore, in addition to the seven control lines described with reference to FIG. 23, the pixel signal line 16 further includes two control lines of a control line 160$_{OFG\_s}$ and a control line 160$_{TX\_s}$. The control line 160$_{OFG\_s}$ supplies the control signal OFG. The control line 160$_{TX\_s}$ supplies the control signal TX.

As described above, even when the FD 23 is shared in adjacent rows, applying the configuration of the RS pixel as a sub-pixel allows inhibition of the number of control lines in the pixel signal line 16 as compared with that in a case where the configuration of the GS pixel is applied as a sub-pixel.

5. Third Embodiment

Next, a third embodiment of the present disclosure will be described. In the first embodiment and the variations thereof and the second embodiment described above, a charge retention type pixel is applied to the GS pixel. That is, the GS pixel in the first embodiment and the variations thereof and the second embodiment is configured to temporarily accumulate charges accumulated in the PD 20 by exposure in the MEM 30, convert the charges accumulated in the MEM 30 into voltages with the FD 23, and read the voltages as pixel signals.

This example is not a limitation, and, in the third embodiment of the present disclosure, a voltage retention type pixel is applied as the GS pixel. The voltage retention type pixel converts charges accumulated in the PD 20 by exposure into voltages with the FD 23, accumulates pixel signals converted into the voltages, and reads the pixel signals at predetermined timing.

Figure 25:
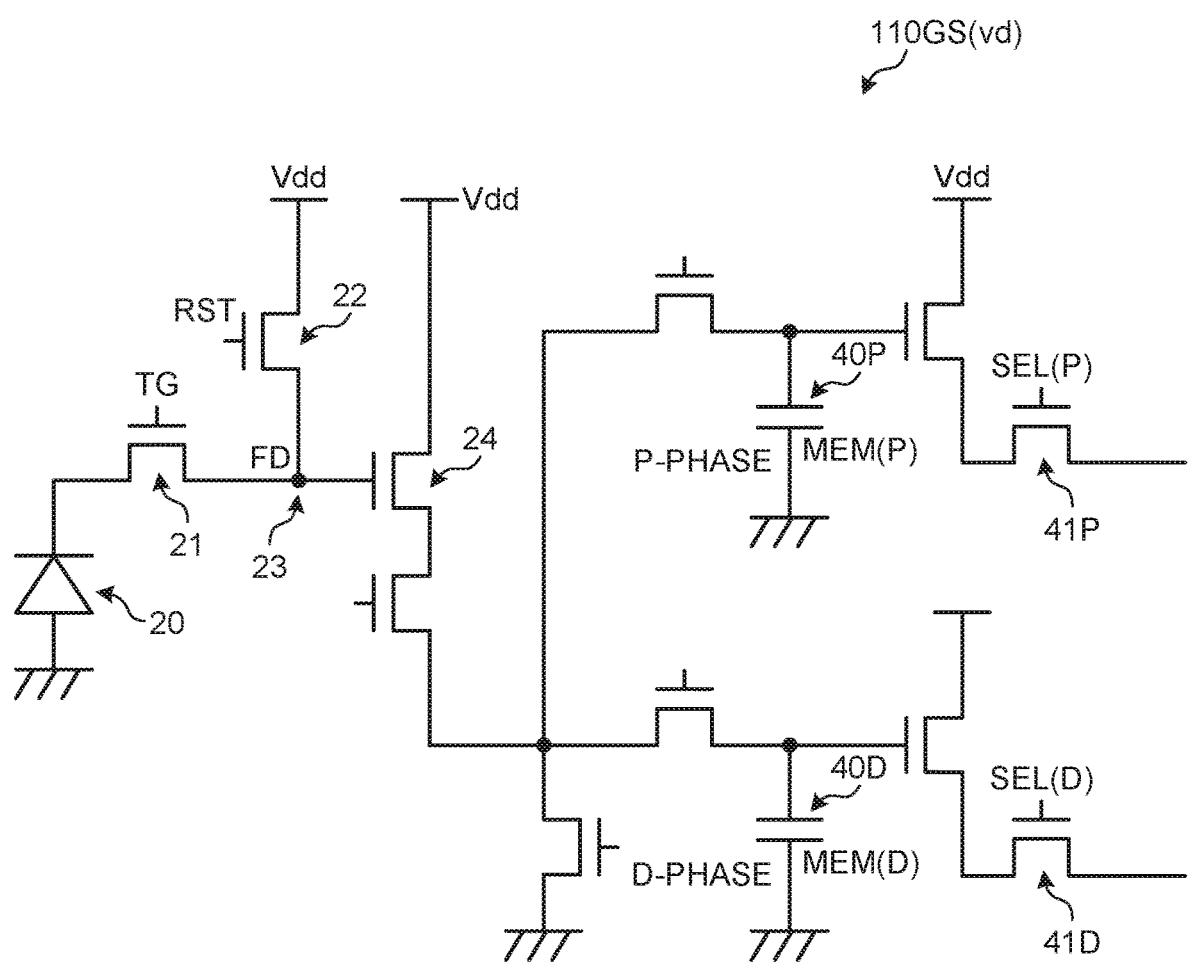
FIG. 25 is a circuit diagram depicting an exemplary configuration of a voltage retention type GS pixel applicable to the fourth embodiment.

FIG. 25 is a circuit diagram depicting an exemplary configuration of the voltage retention type GS pixel applicable to the third embodiment. The configuration in FIG. 25 is obtained by adding a configuration for voltage retention to the position of a vertical signal line VSL in the configuration of the RS pixel (pixel 110RS) described with reference to FIG. 6.

In FIG. 25, the pixel 110GS(vd) includes a first voltage retention section 40P and a second voltage retention section 40D as configurations for voltage retention. The first voltage retention section 40P (MEM(P)) retains the potential of a pre-charge (P-phase), that is, the potential at the time of resetting the FD 23. The second voltage retention section 40D (MEM(D)) retains the potential of a data phase (D-phase), that is, the signal potential of a pixel signal.

The retention potential of the first voltage retention section 40P is read via the vertical signal line VSL (not illustrated) by supplying a control signal SEL(P) to the gate of a transistor 41P and turning on the transistor 41P. The retention potential of the second voltage retention section 40D is read via the vertical signal line VSL by supplying a control signal SEL(D) to the gate of a transistor 41D and turning on the transistor 41P. In correlated double sampling (CDS), noise components can be removed by performing correlated double sampling (CDS) in which the potential of the P-phase is subtracted from the potential of the D-phase.

The voltage retention type pixel 110GS(vd) needs more control signals than the above-described charge retention type pixel 110GS, and also has more control lines in the pixel signal line 16. Also in this case, applying an RS pixel (for example, pixel 110RS) as a sub-pixel mixed in the same pixel row allows inhibition of the number of control lines in the pixel signal line 16 as compared with that in a case where the pixel 110GS(vd) is applied to the sub-pixel.

Note that, also in the voltage retention type pixel 1100GS(vd), the FD 23 is initialized in accordance with the state of the control signal RST as described above. In addition, as described with reference to FIG. 23, the pixel 1100GS(vd) can share the FD 23 with the pixel 1100RS arranged in the same column as the pixel 1100GS(vd) in the adjacent row.

6. Fourth Embodiment

6-1. Examples of Application of Technology of Present Disclosure

Figure 26:
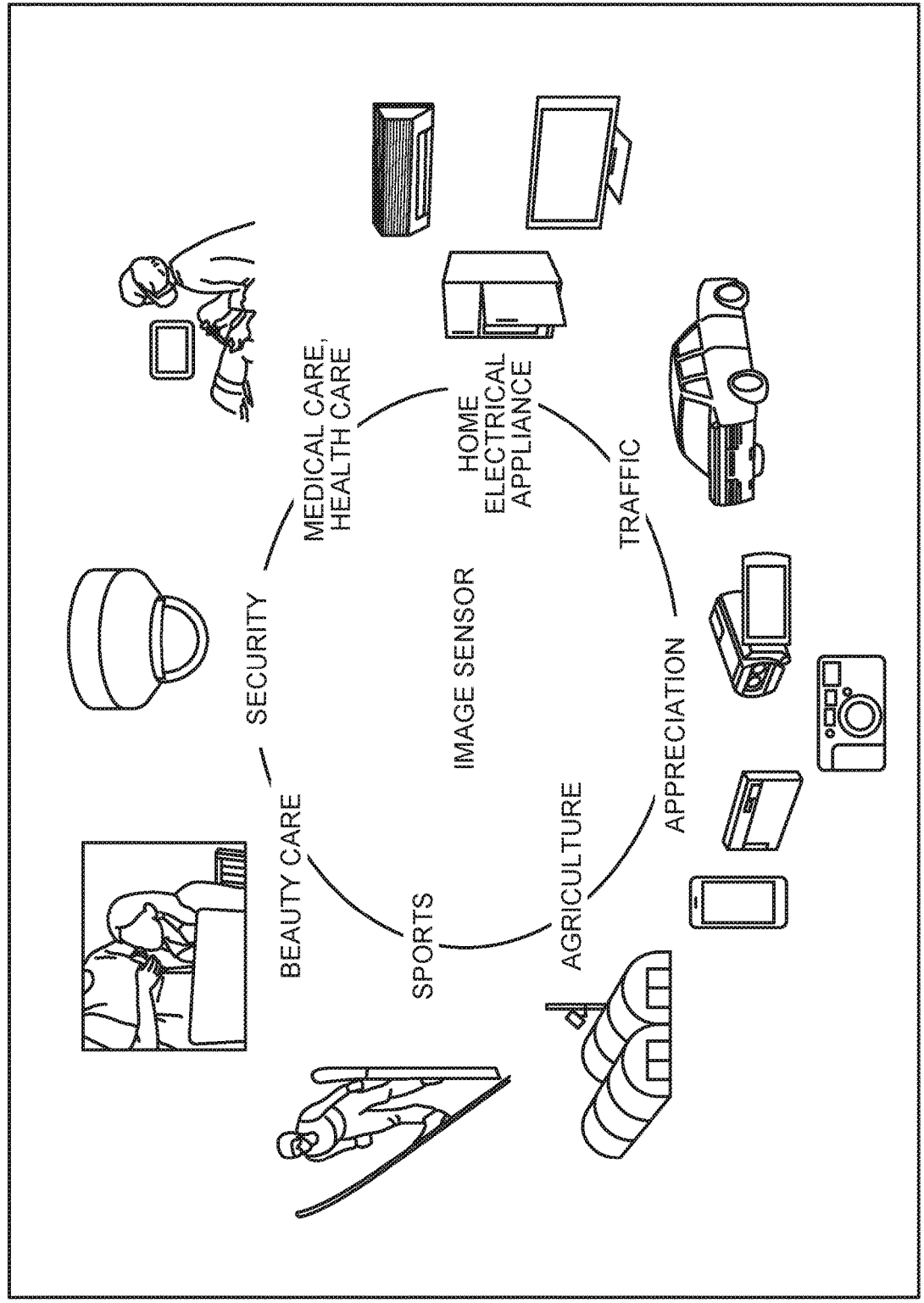
FIG. 26 depicts usage examples in which an electronic device according to the first embodiment and the variations thereof, the second embodiment, and the third embodiment is used.

Next, application examples of the electronic device 1 according to the first embodiment and the variations thereof, the second embodiment, and the third embodiment of the present disclosure will be described as a fourth embodiment. FIG. 26 depicts usage examples in which the electronic device 1 according to the first embodiment and the variations thereof, the second embodiment, and the third embodiment is used.

For example, the above-described electronic device 1 can be used as follows in various cases in which light such as visible light, infrared light, ultraviolet light, and X-rays is sensed and recognition processing is performed on the basis of the sensing result.

- A device that captures an image provided for appreciation, such as a digital camera and a portable device with a camera function.
- A device provided for traffic, such as a vehicle-mounted sensor, a monitoring camera, and a distance measurement sensor, the vehicle-mounted sensor photographing, for example, the front, back, surroundings, and inside of an automobile for safe driving such as automatic stop, recognition of the state of a driver, and the like, the monitoring camera monitoring a traveling vehicle and a road, the distance measurement sensor measuring, for example, a distance between vehicles.
- A device provided for a home electrical appliance, such as a TV, a refrigerator, and an air conditioner, for photographing a gesture of a user and operating an instrument in accordance with the gesture.
- A device provided for medical care or health care, such as an endoscope and a device that performs angiography by receiving infrared light.
- A device provided for security, such as a monitoring camera for security and a camera for person authentication.
- A device provided for beauty care, such as a skin measuring instrument that photographs skin and a microscope that photographs a scalp.
- A device provided for sports, such as an action camera and a wearable camera for sports.

A device provided for agriculture, such as a camera for monitoring the states of fields and crops

6-2. Example of Application to Mobile Body

The technology according to the present disclosure (present technology) can be applied to various products. For example, the technology according to the present disclosure may be implemented as a device mounted in a mobile body of any type of an automobile, an electric vehicle, a hybrid electric vehicle, a motorcycle, a bicycle, a personal mobility, an airplane, a drone, a ship, a robot, and the like.

Figure 27:
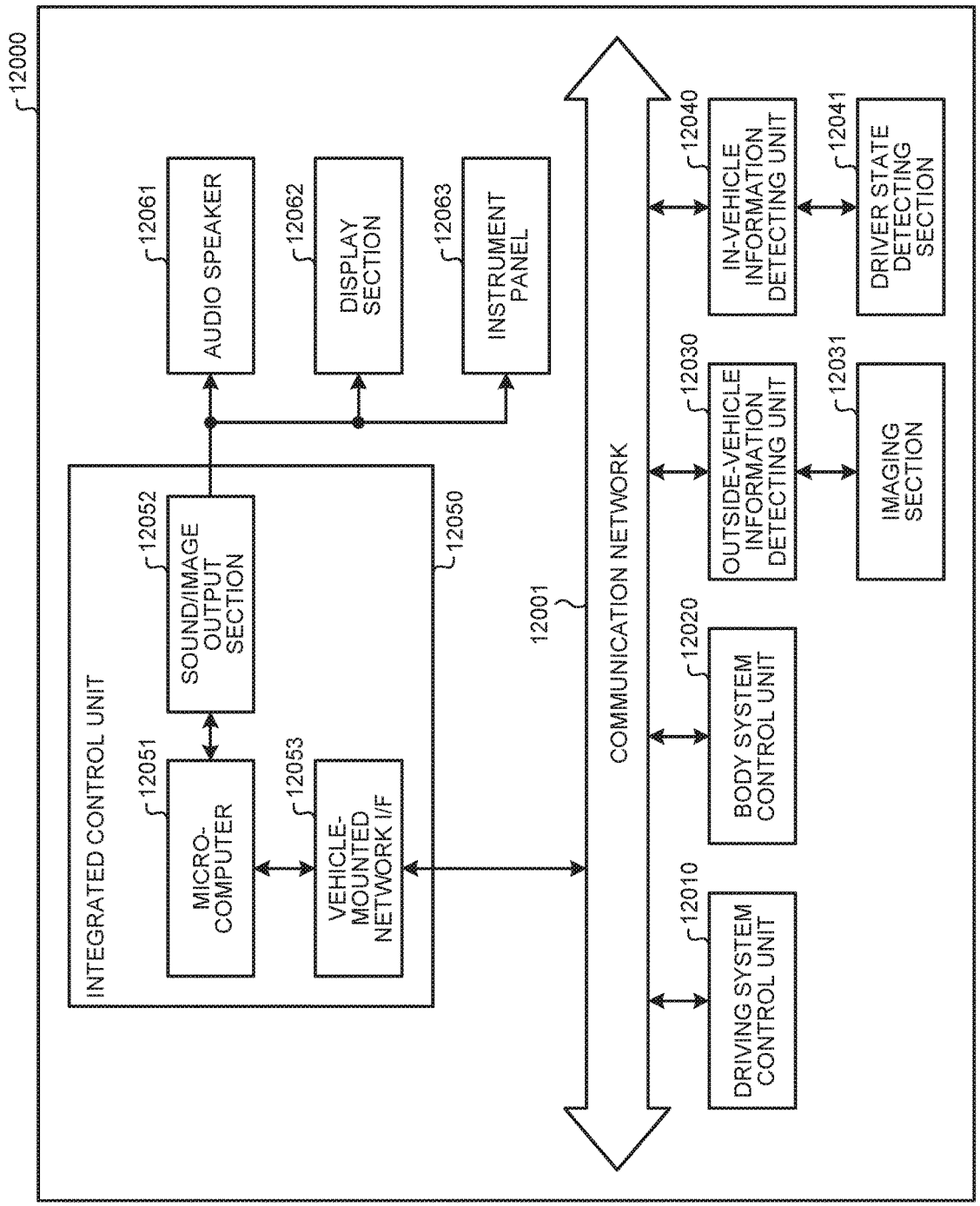
FIG. 27 is a block diagram depicting an example of schematic configuration of a vehicle control system as an example of a mobile body control system to which the technology according to the present disclosure can be applied.

FIG. 27 is a block diagram depicting an example of schematic configuration of a vehicle control system as an example of a mobile body control system to which the technology according to the present disclosure can be applied.

A vehicle control system 12000 includes a plurality of electronic control units connected to each other via a communication network 12001. In the example depicted in FIG. 27, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 27, an audio speaker 12061, a display section 12062, and an instrument panel 12063 are illustrated as the output device. The display section 12062 may, for example, include at least one of an on-board display and a head-up display.

Figure 28:
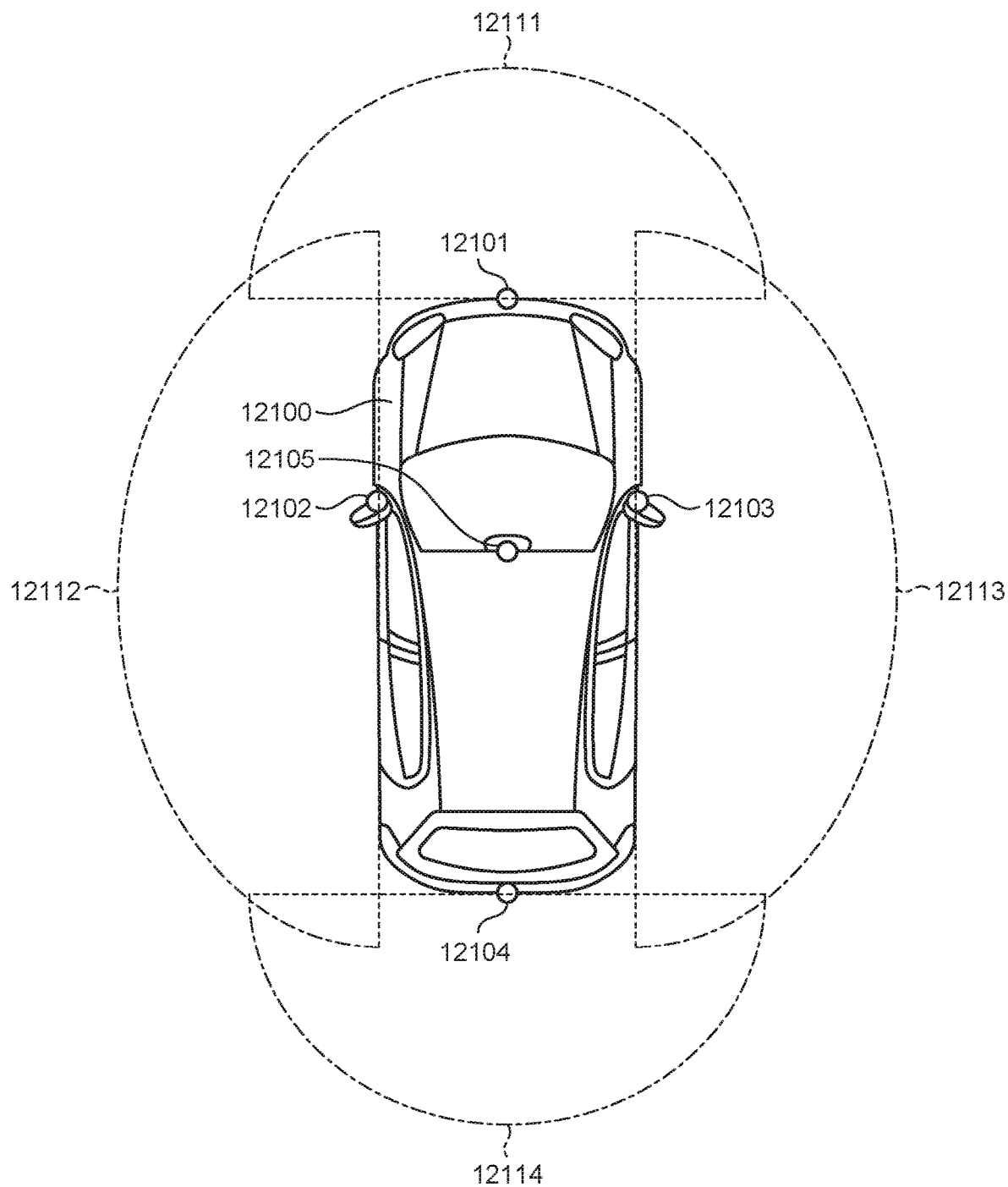
FIG. 28 depicts an example of an installation position of an imaging section.

FIG. 28 is a diagram depicting an example of the installation position of the imaging section 12031.

In FIG. 28, a vehicle 12100 includes imaging sections 12101, 12102, 12103, 12104, and 12105 serving as the imaging sections 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 28 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 and the outside-vehicle information detecting unit 12030 among the above-described configurations.

As described above, the yield of a product can be improved, and costs can be reduced by applying the technology according to the present disclosure to the imaging section 12031 and the outside-vehicle information detecting unit 12030.

Note that the effects set forth in the specification are merely examples and not limitations. Other effects may be obtained.

Note that the present technology can also have the configurations as follows.

(1) An imaging device comprising:
   a plurality of pixels each including a photoelectric conversion element and arranged in an array of matrix;
   a control line group including a plurality of control lines for controlling each of pixels aligned in a row direction, each arranged in each of rows of the array; and
   a plurality of reading lines arranged in each of columns for transferring a pixel signal read from each of pixels aligned in a column direction of the array,
   wherein the plurality of pixels includes:
   a first pixel controlled by a control signal supplied from a first control line group including control lines in a first number among a plurality of control lines included in the control line group in each of pixels aligned in the row direction in at least one of rows of the array; and
   a second pixel controlled by a control signal supplied from a second control line group including a control line in a second number smaller than the first number among a plurality of control lines included in the control line group.

(2) The imaging device according to the above (1),
  wherein exposure start and exposure end of the first pixel is controlled at collective timing in rows of the array by the control signal supplied from the first control line group, and exposure start and exposure end of the second pixel is controlled at different timing in rows of the array by the control signal supplied from the second control line group.
(3) The imaging device according to the above (1) or (2),
  wherein the first pixel includes:
    a first accumulation section that accumulates a charge generated by the photoelectric conversion element in accordance with a control signal from a first control line included in the control line group;
    a first charge voltage conversion section that converts the charge accumulated in the first accumulation section into a voltage in accordance with a control signal from a second control line included in the control line group; and
    a first selection section that outputs a pixel signal based on the voltage obtained by the first charge voltage conversion section converting the charge to the reading line in accordance with a control signal from a third control line included in the control line group, and
  the second pixel includes:
    a second charge voltage conversion section that converts the charge generated by the photoelectric conversion element into a voltage in accordance with a control signal from a fourth control line included in the control line group; and
    a second selection section that outputs a pixel signal based on the voltage obtained by the second charge voltage conversion section converting the charge to the reading line in accordance with a control signal from the third control line included in the control line group, and
    the first charge voltage conversion section and the second charge voltage conversion section are initialized by the control signal supplied from a same control line included in the control line group.
(4) The imaging device according to the above (3),
  wherein the first charge voltage conversion section of the first pixel in a predetermined row of the array and the second charge voltage conversion section of the second pixel whose position corresponds to a position of the first pixel in a row adjacent to the predetermined row of the array are shared.
(5) The imaging device according to the above (1) or (2),
  wherein the first pixel includes:
    a third charge voltage conversion section that converts a charge generated by the photoelectric conversion element into a voltage in accordance with a control signal from a fifth control line included in the control line group;
    a second accumulation section that accumulates a signal obtained by the third charge voltage conversion section converting the charge into a voltage in accordance with a control signal from a sixth control line included in the control line group; and
    a third selection section that reads the signal accumulated in the second accumulation section from a seventh control line included in the control line group in accordance with a control signal as a pixel signal, and outputs the signal to the reading line, and
  the second pixel includes:
    a second charge voltage conversion section that converts the charge generated by the photoelectric conversion element into a voltage in accordance with a control signal from an eighth control line included in the control line group; and
    a second selection section that outputs a pixel signal based on the voltage obtained by the second charge voltage conversion section converting the charge to the reading line in accordance with a control signal from the seventh control line included in the control line group, and
    the third charge voltage conversion section and the second charge voltage conversion section are initialized by the control signal supplied from a same control line included in the control line group.
(6) The imaging device according to the above (5),
  wherein the third charge voltage conversion section of the first pixel in a predetermined row of the array and the second charge voltage conversion section of the second pixel whose position corresponds to a position of the first pixel in a row adjacent to the predetermined row of the array are shared.
(7) The imaging device according to any one of the above (1) to (6),
  wherein the second pixel includes:
    a pixel in which a part of a light receiving surface is shielded from light, light being incident on the photoelectric conversion element on the light receiving surface; and
    a pixel in which a part opposite to a part corresponding to the part of the light receiving surface is shielded from light.
(8) The imaging device according to any one of the above (1) to (6),
  wherein the second pixel includes
    two photoelectric conversion elements,
    a part of a light receiving surface on which light is incident on one photoelectric conversion element of the two photoelectric conversion elements is shielded from light, and
    a part opposite to a part corresponding to the part on a light receiving surface on which light is incident on another photoelectric conversion element is shielded from light.
(9) The imaging device according to any one of the above (1) to (8),
  wherein an imaging operation including exposure start and exposure end in the second pixel and transfer of a pixel signal in accordance with a charge generated by exposure to the reading line is repeatedly executed at a fixed time interval, and
    at predetermined timing, the imaging operation is switched to an imaging operation including exposure start and exposure end in the first pixel and transfer of a pixel signal in accordance with a charge generated by exposure to the reading line.
(10) The imaging device according to any one of the above (1) to (8),
  wherein a first imaging operation including exposure start and exposure end in the second pixel and transfer of a pixel signal in accordance with a charge generated by exposure to the reading line is repeatedly executed at a fixed time interval, and
    at predetermined timing, a second imaging operation including exposure start and exposure end in the first pixel and transfer of a pixel signal in accordance with a charge generated by exposure to the reading line is executed in parallel with the first imaging operation.

(11) The imaging device according to the above (10),
wherein the fixed time interval is a frame interval for displaying a moving image with a pixel signal based on the second pixel.
(12) The imaging device according to any one of the above (1) to (11),
wherein an optical filter that transmits light in an entire visible light wavelength band is disposed in the second pixel.
(13) The imaging device according to any one of the above (1) to (12),
wherein an optical filter that transmits light in an infrared wavelength band is disposed in the second pixel.
(14) The imaging device according to any one of the above (1) to (13),
wherein an optical filter that transmits light in a predetermined wavelength band used for full color imaging is disposed in the second pixel.
(15) The imaging device according to any one of the above (1) to (14),
wherein an optical filter that transmits light in a predetermined wavelength band used for full color imaging is disposed in the first pixel.
(16) An electronic device comprising:
an imaging section includes:
a plurality of pixels each including a photoelectric conversion element and arranged in an array of matrix;
a control line group including a plurality of control lines for controlling each of pixels aligned in a row direction, each arranged in each of rows of the array; and
a plurality of reading lines arranged in each of columns for transferring a pixel signal read from each of pixels aligned in a column direction of the array,
wherein the plurality of pixels includes:
a first pixel controlled by a control signal supplied from a first control line group including control lines in a first number among a plurality of control lines included in the control line group in each of pixels aligned in the row direction in at least one of rows of the array; and
a second pixel controlled by a control signal supplied from
a second control line group including a control line in a second number smaller than the first number among a plurality of control lines included in the control line group; and
a storage section that stores image data based on the pixel signal.

REFERENCE SIGNS LIST

1 ELECTRONIC DEVICE
3 OVERALL CONTROL SECTION
4 IMAGING ELEMENT
5 IMAGE PROCESSING SECTION
7 STORAGE SECTION
8 DISPLAY SECTION
11 PIXEL ARRAY
16 PIXEL SIGNAL LINE
19 ELEMENT CONTROL SECTION
20, 20a, 20b, 20L, 20R PHOTODIODE
21, 21a, 21b, 22, 23, 24, 25, 31, 32 TRANSISTOR
30 MEM
110, 110GS, 110GS', 110GS(vd), 110RS, $110RS_{2PD}$, $110RS_{ZL}$, $110RS_{ZR}$ PIXEL
$160_{OFG}$, $160_{OFG\_m}$, $160_{OFG\_s}$, $160_{TG\_m}$, $160_{TG\_m(a)}$, $160_{TG\_m(b)}$, $160_{TG\_s}$, $160_{TX}$, $160_{TX\_m}$, $160_{TX\_s}$, $160_{RST}$, $160_{SEL}$ CONTROL LINE

212 OPTICAL FILTER
300 IMAGING REGION
301 REGION OF INTEREST

The invention claimed is:
1. An imaging device, comprising:
a plurality of pixels each including a photoelectric conversion element, wherein the plurality of pixels is in an array of matrix, and the photoelectric conversion element is configured to generate a charge;
a control line group including a plurality of control lines for control of each pixel of the plurality of pixels aligned in a row direction, each arranged in each of rows of the array; and
a plurality of reading lines in each of columns of the array for transfer of a pixel signal read from each pixel of the plurality of pixels aligned in a column direction of the array,
wherein the plurality of pixels includes:
a first pixel controlled by a control signal supplied from a first control line group including control lines in a first number among the plurality of control lines in each of the plurality of pixels aligned in the row direction in at least one of the rows of the array; and
a second pixel controlled by a control signal supplied from a second control line group including a control line in a second number smaller than the first number among the plurality of control lines, and
the first pixel includes:
a first accumulation section configured to accumulate the charge, generated by the photoelectric conversion element, based on a control signal from a first control line of the control line group;
a first charge voltage conversion section configured to convert the accumulated charge into a voltage based on a control signal from a second control line of the control line group; and
a first selection section configured to output a pixel signal to a reading line of the plurality of reading lines based on the voltage and a control signal from a third control line of the control line group.
2. The imaging device according to claim 1,
wherein exposure start and exposure end of the first pixel is controlled at collective timing in the rows of the array by the control signal supplied from the first control line group, and
exposure start and exposure end of the second pixel is controlled at different timing in the rows of the array by the control signal supplied from the second control line group.
3. The imaging device according to claim 1,
wherein the second pixel includes:
a second charge voltage conversion section configured to convert the charge generated by the photoelectric conversion element into a voltage in accordance with a control signal from a fourth control line included in the control line group; and
a second selection section configured to output a pixel signal based on the voltage obtained by the second charge voltage conversion section converting the charge to the reading line in accordance with the control signal from the third control line included in the control line group, and
the first charge voltage conversion section and the second charge voltage conversion section are initialized by the control signal supplied from a same control line included in the control line group.

4. The imaging device according to claim 3,
wherein the first charge voltage conversion section of the first pixel in a predetermined row of the array and the second charge voltage conversion section of the second pixel whose position corresponds to a position of the first pixel in a row adjacent to the predetermined row of the array are shared.

5. The imaging device according to claim 1,
wherein the first pixel includes:
a third charge voltage conversion section configured to convert the charge generated by the photoelectric conversion element into a voltage in accordance with a control signal from a fifth control line included in the control line group;
a second accumulation section configured to accumulate a signal obtained by the third charge voltage conversion section converting the charge into the voltage in accordance with a control signal from a sixth control line included in the control line group; and
a third selection section configured to read the signal accumulated in the second accumulation section from a seventh control line included in the control line group in accordance with a control signal as a pixel signal, and output the signal to the reading line, and
the second pixel includes:
a second charge voltage conversion section configured to convert the charge generated by the photoelectric conversion element into a voltage in accordance with a control signal from an eighth control line included in the control line group; and
a second selection section configured to output a pixel signal based on the voltage obtained by the second charge voltage conversion section converting the charge to the reading line in accordance with a control signal from the seventh control line included in the control line group, and
the third charge voltage conversion section and the second charge voltage conversion section are initialized by the control signal supplied from a same control line included in the control line group.

6. The imaging device according to claim 5,
wherein the third charge voltage conversion section of the first pixel in a predetermined row of the array and the second charge voltage conversion section of the second pixel whose position corresponds to a position of the first pixel in a row adjacent to the predetermined row of the array are shared.

7. The imaging device according to claim 1,
wherein the second pixel includes:
a pixel in which a part of a light receiving surface is shielded from light, the light being incident on the photoelectric conversion element on the light receiving surface; and
a pixel in which a part opposite to a part corresponding to the part of the light receiving surface is shielded from the light.

8. The imaging device according to claim 1,
wherein the second pixel include two photoelectric conversion elements,
the two photoelectric conversion elements include the photoelectric conversion element of the second pixel,
a part of a light receiving surface on which light is incident on one photoelectric conversion element of the two photoelectric conversion elements is shielded from the light, and a part opposite to a part corresponding to the part on the light receiving surface on which the light is incident on another photoelectric conversion element is shielded from the light.

9. The imaging device according to claim 1,
wherein an imaging operation including exposure start and exposure end in the second pixel and transfer of a pixel signal in accordance with a charge generated by exposure to the reading line is repeatedly executed at a fixed time interval, and
at predetermined timing, the imaging operation is switched to an imaging operation including exposure start and exposure end in the first pixel and transfer of a pixel signal in accordance with a charge generated by exposure to the reading line.

10. The imaging device according to claim 1,
wherein a first imaging operation including exposure start and exposure end in the second pixel and transfer of a pixel signal in accordance with a charge generated by exposure to the reading line is repeatedly executed at a fixed time interval, and
at predetermined timing, a second imaging operation including exposure start and exposure end in the first pixel and transfer of a pixel signal in accordance with a charge generated by exposure to the reading line is executed in parallel with the first imaging operation.

11. The imaging device according to claim 10,
wherein the fixed time interval is a frame interval for displaying a moving image with a pixel signal based on the second pixel.

12. The imaging device according to claim 1,
wherein an optical filter that transmits light in an entire visible light wavelength band is in the second pixel.

13. The imaging device according to claim 1,
wherein an optical filter that transmits light in an infrared wavelength band is in the second pixel.

14. The imaging device according to claim 1,
wherein an optical filter that transmits light in a predetermined wavelength band used for full color imaging is disposed in the second pixel.

15. The imaging device according to claim 1,
wherein an optical filter that transmits light in a predetermined wavelength band used for full color imaging is in the first pixel.

16. An electronic device, comprising:
an imaging section that includes:
a plurality of pixels each including a photoelectric conversion element, wherein the plurality of pixels is in an array of matrix, and the photoelectric conversion element is configured to generate a charge;
a control line group including a plurality of control lines for control of each pixel of the plurality of pixels aligned in a row direction, each arranged in each of rows of the array; and
a plurality of reading lines in each of columns of the array for transfer a pixel signal read from each pixel of the plurality of pixels aligned in a column direction of the array,
wherein the plurality of pixels includes:
a first pixel controlled by a control signal supplied from a first control line group including control lines in a first number among the plurality of control lines in each pixel of the plurality of pixels aligned in the row direction in at least one of the rows of the array; and
a second pixel controlled by a control signal supplied from a second control line group including a control line in a second number smaller than the first number among the plurality of control lines; and a storage section configured to store image data based on the pixel signal, wherein the first pixel includes:

a first accumulation section configured to accumulate the charge, generated by the photoelectric conversion element, based on a control signal from a first control line of the control line group;

a first charge voltage conversion section configured to convert the accumulated charge into a voltage based on a control signal from a second control line of the control line group; and a first selection section configured to output a pixel signal to a reading line of the plurality of reading lines based on the voltage and a control signal from a third control line of the control line group.

* * * * *